(12) United States Patent
Suskic

(10) Patent No.: US 8,290,725 B2
(45) Date of Patent: Oct. 16, 2012

(54) SYNCHRONIZED RECONFIGURATION OF MEASUREMENT MODULES

(75) Inventor: Sead Suskic, Austin, TX (US)

(73) Assignee: National Instruments Corporation, Austin, TX (US)

( * ) Notice: Subject to any disclaimer, the term of this patent is extended or adjusted under 35 U.S.C. 154(b) by 283 days.

(21) Appl. No.: 12/713,007

(22) Filed: Feb. 25, 2010

(65) Prior Publication Data

US 2011/0119000 A1     May 19, 2011

Related U.S. Application Data

(60) Provisional application No. 61/262,380, filed on Nov. 18, 2009.

(51) Int. Cl.
| | |
|---|---|
| G01R 31/00 | (2006.01) |
| G01R 15/00 | (2006.01) |
| G01D 18/00 | (2006.01) |
| G01D 21/00 | (2006.01) |
| G01R 31/28 | (2006.01) |

(52) U.S. Cl. ............ 702/58; 702/85; 702/117; 702/119; 324/750.01

(58) Field of Classification Search ............ 702/58, 702/57, 85, 117, 119, 120, 127; 324/750.3, 324/750.01, 750.02, 750.14

See application file for complete search history.

(56) References Cited

U.S. PATENT DOCUMENTS

| | | | |
|---|---|---|---|
| 4,768,195 A | 8/1988 | Stoner et al. | |
| 5,603,043 A | 2/1997 | Taylor et al. | |
| 5,767,500 A | 6/1998 | Cordes et al. | |
| 6,073,160 A | 6/2000 | Grantham et al. | |
| 6,081,533 A | 6/2000 | Laubach et al. | |
| 6,219,153 B1 | 4/2001 | Kawanabe et al. | |
| 6,219,628 B1 | 4/2001 | Kodosky et al. | |
| 6,344,739 B1 | 2/2002 | Hardy et al. | |
| 6,584,601 B1 | 6/2003 | Kodosky et al. | |
| 6,822,459 B1 | 11/2004 | Romero et al. | |
| 6,823,283 B2 | 11/2004 | Steger et al. | |
| 6,833,715 B2 | 12/2004 | Sakaguchi et al. | |
| 6,876,941 B2 | 4/2005 | Nightingale | |
| 7,085,670 B2 | 8/2006 | Odom et al. | |
| 7,165,005 B2 | 1/2007 | Steger et al. | |
| 7,254,512 B2 | 8/2007 | Odom | |
| 7,290,244 B2 | 10/2007 | Peck et al. | |
| 7,366,631 B2 | 4/2008 | Steger et al. | |
| 7,373,395 B2 | 5/2008 | Brailean et al. | |
| 7,463,018 B2 * | 12/2008 | Kushnick et al. | ........ 324/756.02 |

(Continued)

*Primary Examiner* — Michael Nghiem
*Assistant Examiner* — Ricky Ngon
(74) *Attorney, Agent, or Firm* — Meyertons Hood Kivlin Kowert & Goetzel, P.C.; Jeffrey C. Hood; Joel L. Stevens

(57) ABSTRACT

Configuring at least one radio frequency (RF) instrument according to a plurality of RF measurement configurations for performing a plurality of tests on a device under test (DUT). A list of RF measurement configurations may be stored in a computer memory. The list of RF measurement configurations comprises a plurality of parameters for configuring operation of the at least one instrument. Information regarding the list of RF measurement configurations (e.g., a data stream) may be provided to the at least one RF instrument. The at least one RF instrument may perform the plurality of tests on the DUT, including the at least one RF instrument configuring itself according to the RF measurement configurations based on processing of the information. Configuring enables the at least one RF instrument to perform the plurality of tests on the DUT in a deterministic manner.

20 Claims, 16 Drawing Sheets

U.S. PATENT DOCUMENTS

| | | |
|---|---|---|
| 7,478,006 B2 | 1/2009 | Odom |
| 7,509,445 B2 | 3/2009 | Odom et al. |
| 7,512,512 B2 * | 3/2009 | Foote et al. .................. 702/127 |
| 7,512,725 B2 | 3/2009 | Odom et al. |
| 7,542,867 B2 | 6/2009 | Steger et al. |
| 7,865,320 B2 | 1/2011 | Long et al. |
| 7,881,899 B2 | 2/2011 | Steger et al. |
| 2005/0137653 A1 | 6/2005 | Friedman et al. |
| 2007/0233418 A1 * | 10/2007 | Steger et al. .................. 702/127 |
| 2007/0233431 A1 | 10/2007 | Steger et al. |
| 2011/0057673 A1 * | 3/2011 | Iwamoto et al. ........... 324/750.3 |

* cited by examiner

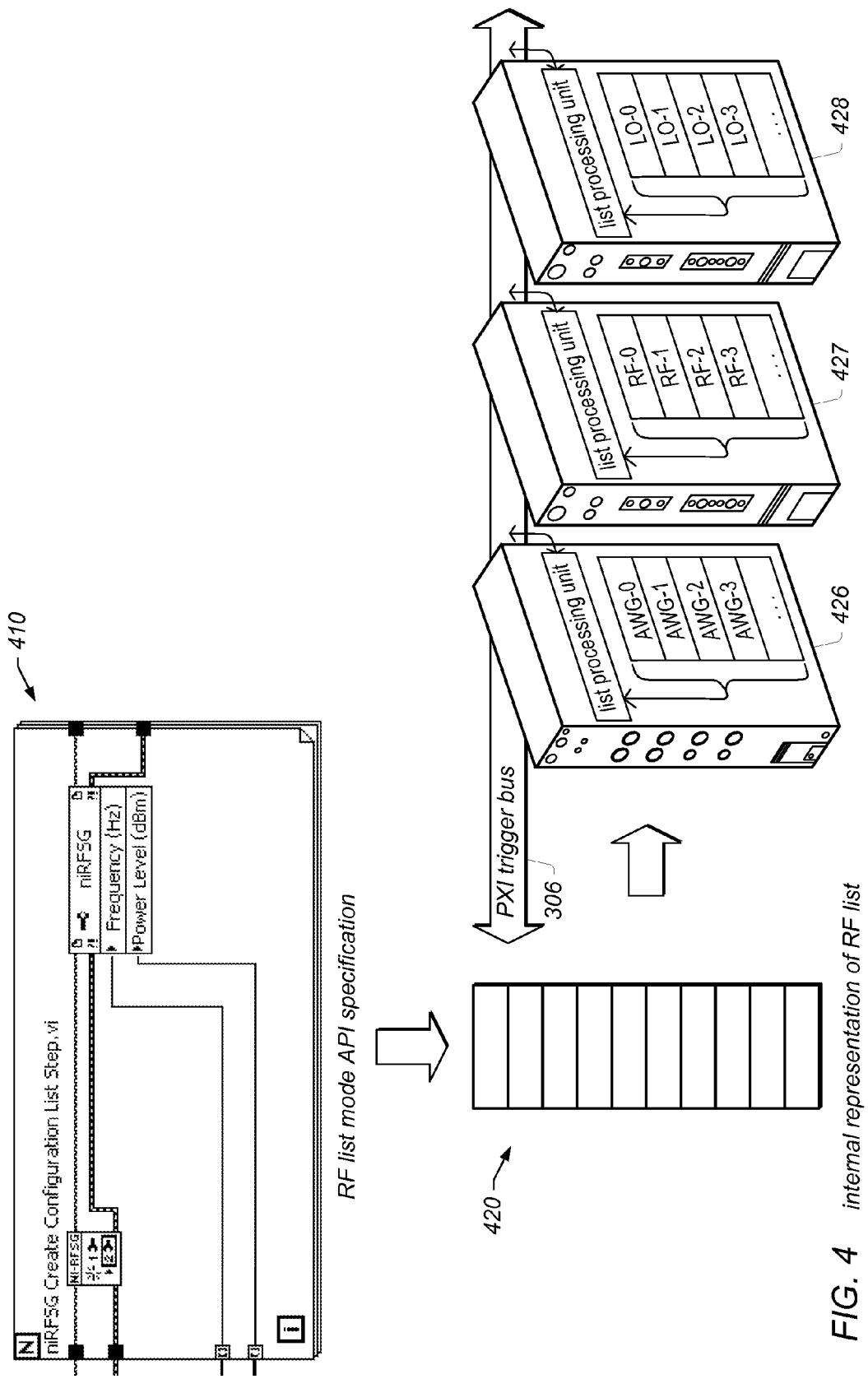
FIG. 4   internal representation of RF list

SYNCHRONIZED RECONFIGURATION OF MEASUREMENT MODULES

PRIORITY INFORMATION

This application claims benefit of priority of U.S. provisional application Ser. No. 61/262,380 titled "Deterministic Reconfiguration of Measurement Modules" filed Nov. 18, 2009, whose inventors were Sead Suskic, Vince Shouba, Kunal Patel, and David Klipec which is hereby incorporated by reference in its entirety as though fully and completely set forth herein.

FIELD OF THE INVENTION

The present invention relates to the field of measurement, and more particularly to a system and method for deterministic reconfiguration of measurement modules.

DESCRIPTION OF THE RELATED ART

Measurement systems often include a host device that is in communication with other devices (measurement devices) to perform a desired task, such as testing of a device under test. While performing such a task, it may be desirable to change configurations of the measurement devices. For example, it may be desirable to perform a first test using the measurement devices and then at a later time perform a second test using the measurement devices. However, in this example, it may be beneficial for the reconfigurations to be performed automatically to provide flexibility and efficiency. Accordingly, improvements in device testing are desired.

SUMMARY OF THE INVENTION

Various embodiments are disclosed of a system and method for configuring a plurality of devices according to a plurality of measurement configurations for performing a plurality of tests on a device under test (DUT). The plurality of devices may be RF devices, such as a signal measurement device (e.g., a vector signal analyzer (VSA)) and a signal generating device (e.g., a vector signal generator (VSG)). The plurality of devices may be measurement modules, e.g., that are housed in a chassis. In one embodiment, the devices may be electrically coupled by an instrumentation bus, such as PXI or PXI Express.

A list of measurement configurations (e.g., RF measurement configurations) may be created in a computer memory. The list of measurement configurations may include a plurality of parameters for configuring operation of the plurality of devices as well as synchronization instructions for enabling configuration changes for the plurality of devices to occur at the same time. For example, the list of measurement configurations may include a specification for reconfiguring the plurality of devices from a first item in the list of measurement configurations to a second item in the list of measurement configurations.

Accordingly, information regarding the list of measurement configurations may be provided to the plurality of devices (e.g., as a data stream, possibly using direct memory access (DMA)). The information may be usable by the plurality of devices to perform the plurality of tests on the DUT. In one embodiment, the information may be an intermediate representation of the list of measurement configurations. Thus, the method may include creating an intermediate representation of the list of measurement configurations (e.g., for each device), and generating the information based on the intermediate representation.

Thus, each device may perform the plurality of tests by configuring itself (e.g., by executing deterministic software processes) according to the list of measurement configurations based on the information. Using the provided information may enable the plurality of devices to perform the plurality of tests on the DUT in a deterministic and synchronized manner.

BRIEF DESCRIPTION OF THE DRAWINGS

A better understanding of the present invention can be obtained when the following detailed description of the preferred embodiment is considered in conjunction with the following drawings, in which:

FIG. 4 illustrates an embodiment of a method for deterministic reconfiguration of measurement modules;

Figure 1A:
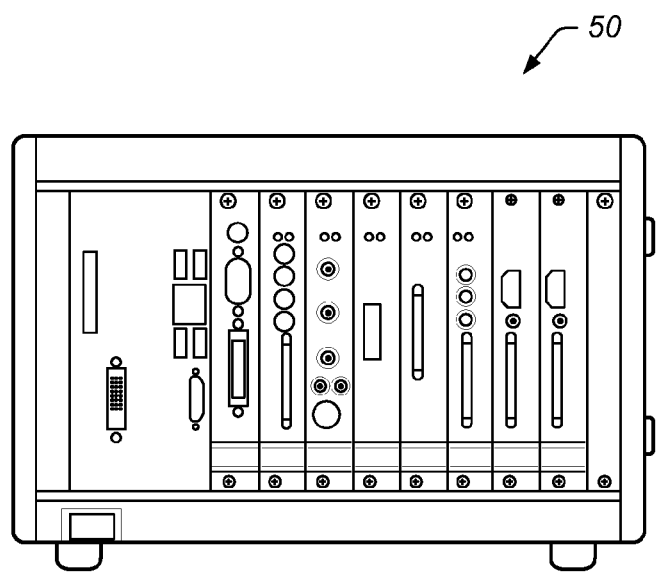
FIG. 1A illustrates a chassis system including a host device and at least two other devices, which may be configured to implement various embodiments of the present invention.

While the invention is susceptible to various modifications and alternative forms, specific embodiments thereof are shown by way of example in the drawings and are herein described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Incorporation by Reference:

The following references are hereby incorporated by reference in their entirety as though fully and completely set forth herein:

U.S. Pat. No. 4,914,568 titled "Graphical System for Modeling a Process and Associated Method," issued on Apr. 3, 1990.

U.S. Pat. No. 5,481,741 titled "Method and Apparatus for Providing Attribute Nodes in a Graphical Data Flow Environment", issued on Jan. 2, 1996.

U.S. Pat. No. 6,173,438 titled "Embedded Graphical Programming System" filed Aug. 18, 1997.

U.S. Pat. No. 6,219,628 titled "System and Method for Configuring an Instrument to Perform Measurement Functions Utilizing Conversion of Graphical Programs into Hardware Implementations," filed Aug. 18, 1997.

U.S. Patent Application Publication No. 20010020291 (Ser. No. 09/745,023) titled "System and Method for Programmatically Generating a Graphical Program in Response to Program Information," filed Dec. 20, 2000.

U.S. Patent Application Publication 2008/0240321 (Ser. No. 11/695,139) titled "Aligning Timebases to Share Synchronized Periodic Signals," filed Apr. 2, 2007.

U.S. Pat. No. 7,315,791, titled "Application programming interface for synchronizing multiple instrumentation devices," filed Feb. 18, 2004.

Terms

The following is a glossary of terms used in the present application:

Memory Medium—Any of various types of memory devices or storage devices. The term "memory medium" is intended to include an installation medium, e.g., a CD-ROM, floppy disks, or tape device; a computer system memory or random access memory such as DRAM, DDR RAM, SRAM, EDO RAM, Rambus RAM, etc.; or a non-volatile memory such as a magnetic media, e.g., a hard drive, or optical storage. The memory medium may comprise other types of memory as well, or combinations thereof. In addition, the memory medium may be located in a first computer in which the programs are executed, and/or may be located in a second different computer which connects to the first computer over a network, such as the Internet. In the latter instance, the second computer may provide program instructions to the first computer for execution. The term "memory medium" may include two or more memory mediums which may reside in different locations, e.g., in different computers that are connected over a network.

Carrier Medium—a memory medium as described above, as well as a physical transmission medium, such as a bus, network, and/or other physical transmission medium that conveys signals such as electrical, electromagnetic, or digital signals.

Programmable Hardware Element—includes various hardware devices comprising multiple programmable function blocks connected via a programmable interconnect. Examples include FPGAs (Field Programmable Gate Arrays), PLDs (Programmable Logic Devices), FPOAs (Field Programmable Object Arrays), and CPLDs (Complex PLDs). The programmable function blocks may range from fine grained (combinatorial logic or look up tables) to coarse grained (arithmetic logic units or processor cores). A programmable hardware element may also be referred to as "reconfigurable logic".

Program—the term "program" is intended to have the full breadth of its ordinary meaning The term "program" includes 1) a software program which may be stored in a memory and is executable by one or more processors or 2) a hardware configuration program useable for configuring a programmable hardware element.

Software Program—the term "software program" is intended to have the full breadth of its ordinary meaning, and includes any type of program instructions, code, script and/or data, or combinations thereof, that may be stored in a memory medium and executed by one or more processors. Exemplary software programs include programs written in text-based programming languages, such as C, C++, PASCAL, FORTRAN, COBOL, JAVA, assembly language, etc.; graphical programs (programs written in graphical programming languages); programs that have been compiled to machine language; scripts; and other types of executable software. A software program may comprise two or more software programs that interoperate in some manner. Note that various embodiments described herein may be implemented by a computer or software program. A software program may be stored as program instructions on a memory medium.

Hardware Configuration Program—a program, e.g., a netlist or bit file, that can be used to program or configure a programmable hardware element.

Computer System—any of various types of computing or processing systems, including a personal computer system (PC), mainframe computer system, workstation, network appliance, Internet appliance, personal digital assistant (PDA), television system, grid computing system, or other device or combinations of devices. In general, the term "computer system" can be broadly defined to encompass any device (or combination of devices) having at least one processor that executes instructions from a memory medium.

Measurement Device—includes instruments, data acquisition devices, smart sensors, and any of various types of devices that are configured to acquire and/or store data. A measurement device may also optionally be further configured to analyze or process the acquired or stored data. Examples of a measurement device include an instrument, such as a traditional stand-alone "box" instrument, a computer-based instrument (instrument on a card) or external instrument, a data acquisition card, a device external to a computer that operates similarly to a data acquisition card, a smart sensor, one or more DAQ or measurement cards or modules in a chassis, an image acquisition device, such as an image acquisition (or machine vision) card (also called a video capture board) or smart camera, a motion control device, a robot having machine vision, and other similar types of devices. Exemplary "stand-alone" instruments include oscilloscopes, multimeters, signal analyzers, arbitrary waveform generators, spectroscopes, and similar measurement, test, or automation instruments.

A measurement device may be further configured to perform control functions, e.g., in response to analysis of the acquired or stored data. For example, the measurement device may send a control signal to an external system, such as a motion control system or to a sensor, in response to particular data. A measurement device may also be configured to perform automation functions, i.e., may receive and analyze data, and issue automation control signals in response.

Figure 1B:
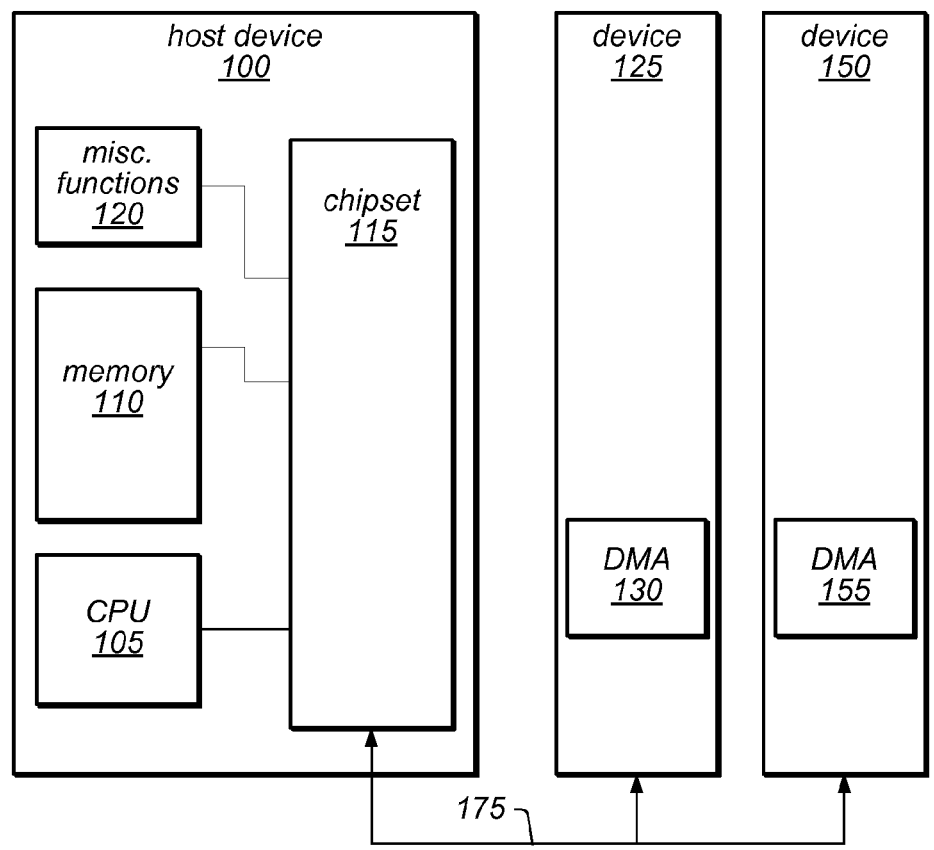
FIGS. 1B and 1C are exemplary block diagrams of the chassis system of FIG. 1A.
Figure 1C:
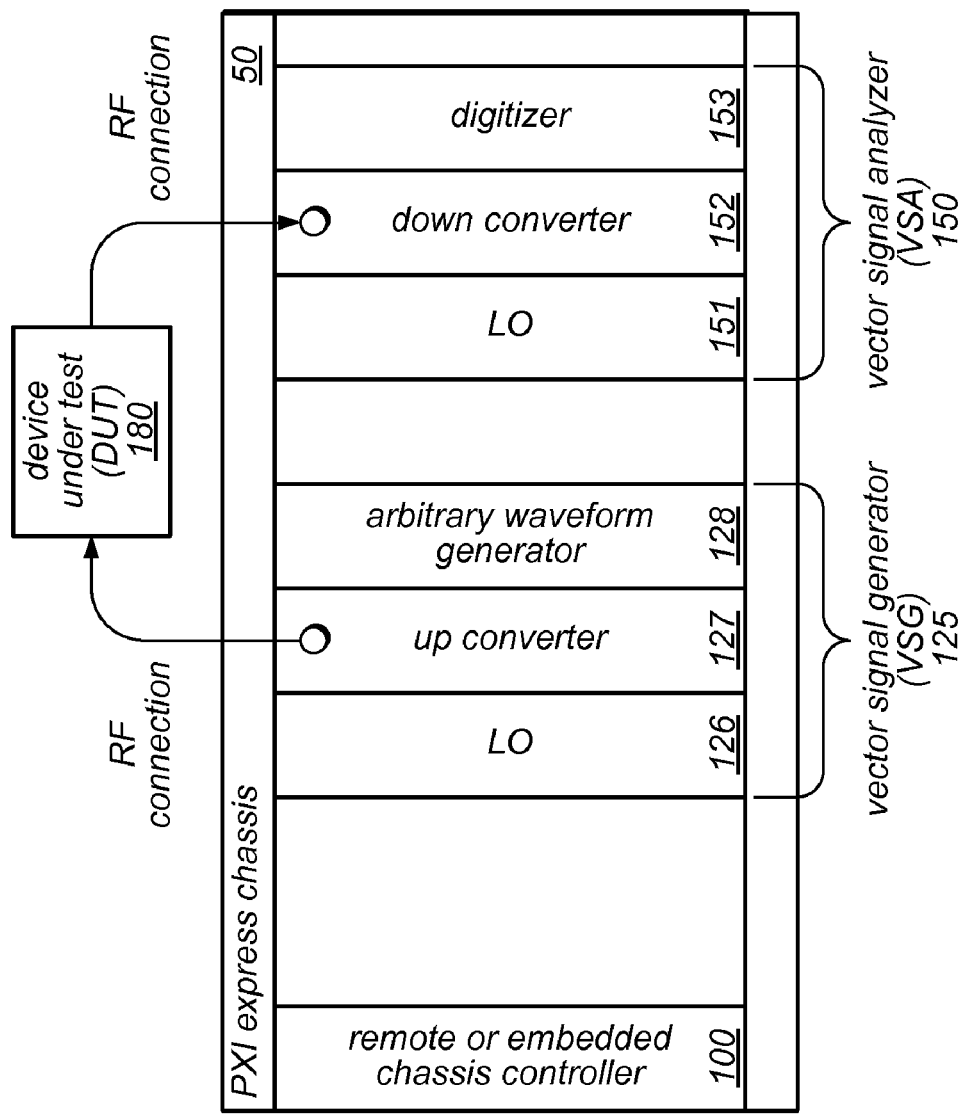

FIGS. 1A-1C—Chassis 50

FIGS. 1A-1C illustrate an exemplary chassis 50. As shown in FIGS. 1A and 1B, the chassis 50 may include a host device 100 (e.g., a host controller board), which may include a CPU 105, memory 110, and chipset 115. Other functions that may be found on the host device 100 are represented by the miscellaneous functions block 120. In some embodiments, the host device may include a processor and memory (as shown) and/or may include a programmable hardware element (e.g., a field programmable gate array (FPGA)). In embodiments where the host device includes a programmable hardware element, it may be configured according to a graphical program as described in the various patents incorporated by reference above.

As shown, the host device 100 (e.g., the chipset 115 of the host device 100) may provide communication (e.g., PCIe communication, PXI communication, or other bus communication) to a first peripheral device 125 and a second peripheral device 150 over bus 175. The first peripheral device 125 and second peripheral device 150 may be configured to change configurations based on information provided by the host device 100, as described herein.

The devices may be any of various devices (e.g., PCIe devices), such as measurement devices (e.g., DAQ devices), processing devices, I/O devices, network devices, etc. Additionally, similar to above, the devices may include one or more programmable hardware elements or processors and memory to implement their respective functionality. In some embodiments, the 125 and the device 150 may include a DMA controller (130 and 155 respectively) to perform DMA transfers, e.g., to perform the transfers of data described herein.

As indicated above, embodiments of chassis 50 may be used in test and measurement systems, such as systems used to acquire, process or output data relating to a device or process being monitored or controlled, for instance. Accordingly, such a system may acquire data, and subsequently transfer the data for processing, storage, output, or the like. For example, in the case of chassis 50 being used to control a process (e.g., a closed loop system) data may be acquired, transferred to a processor where it may be processed, and subsequently transferred to an output such that the processed output may be employed to appropriately control the respective process.

FIG. 1C illustrates an exemplary embodiment of a system, e.g., a modular PXI-based RF test system, which may implement various embodiments of the methods described herein. More specifically, as shown, the chassis 50 may be a PXI express chassis which may include an embedded chassis controller 100. Within the chassis 50, the chassis controller 100 may be coupled to a vector signal generator (VSG) 125 and a vector signal analyzer (VSA) 150, e.g., over a PXI express bus. As shown, the VSG 125 may include a local oscillator (LO) 126, an up converter 127, and an arbitrary waveform generator (AWG) 128. Similarly, the VSA may include LO 151, down converter 152, and digitizer 153.

The VSG and VSA may both be coupled to a device under test (DUT) or unit under test (UUT) 180, e.g., via an RF connection, depending on the embodiment. More particularly, in one embodiment, the VSG 125 may couple to one port of DUT 180 to provide a stimulus signal. The VSA 150 may couple to a different port on the DUT to acquire and measure the DUT's response to the stimulus. Note that FIG. 1C provides a general representation of a modular test system, and while this diagram presents a system with a VSA, a VSG, and a DUT, in practice, these systems might have only a VSA or VSG, and a DUT. For example, the system may be used to characterize the DUT's transmitter, or the DUT's receiver, or both, although other devices and configurations are envisioned.

In some embodiments, the VSG 125 and VSA 150 may correctly interface with the DUT as long as the accompanying driver software is used to apply the appropriate RF configuration to the two devices. Consequently, if the devices' RF configuration needs to be changed because the DUT RF settings change, the controlling program may call the appropriate functions in the VSA and VSG driver software. However, certain DUTs have such requirements that the RF configuration changes are not acceptable in terms of timing repeatability. In these particular cases, the methods described herein may be used to make the configuration changes (e.g., the RF configuration changes) deterministic.

Thus, FIG. 1C illustrates a particular embodiment where the devices 125 and 150 are used to test a DUT (e.g., an RF DUT). More specific embodiments which may be applicable to FIGS. 1A-1C (and in particular, 1C) are provided below.

Figure 2A:
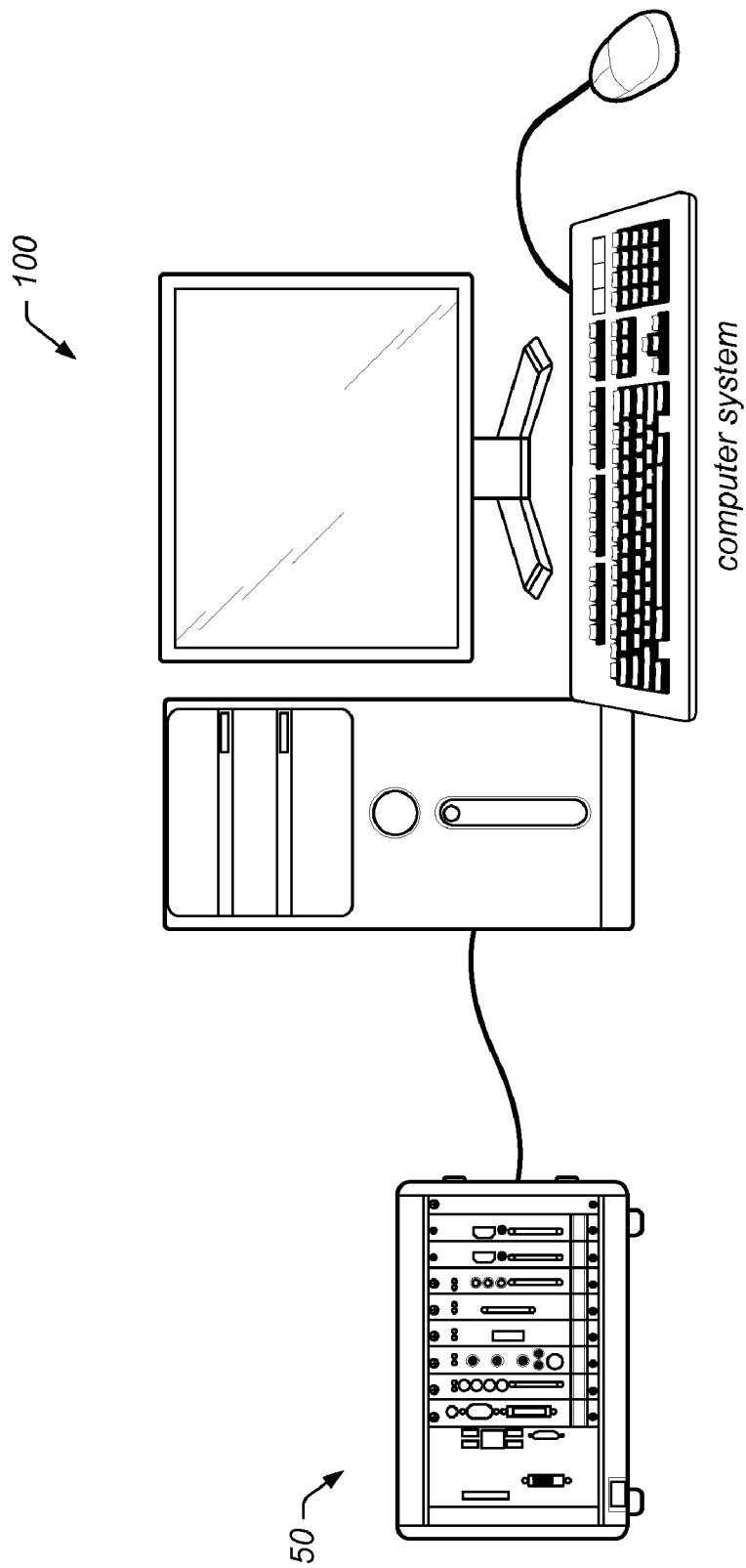
FIGS. 2A-2C illustrates various exemplary systems which may be configured to implement various embodiments of the present invention.
Figure 2B:
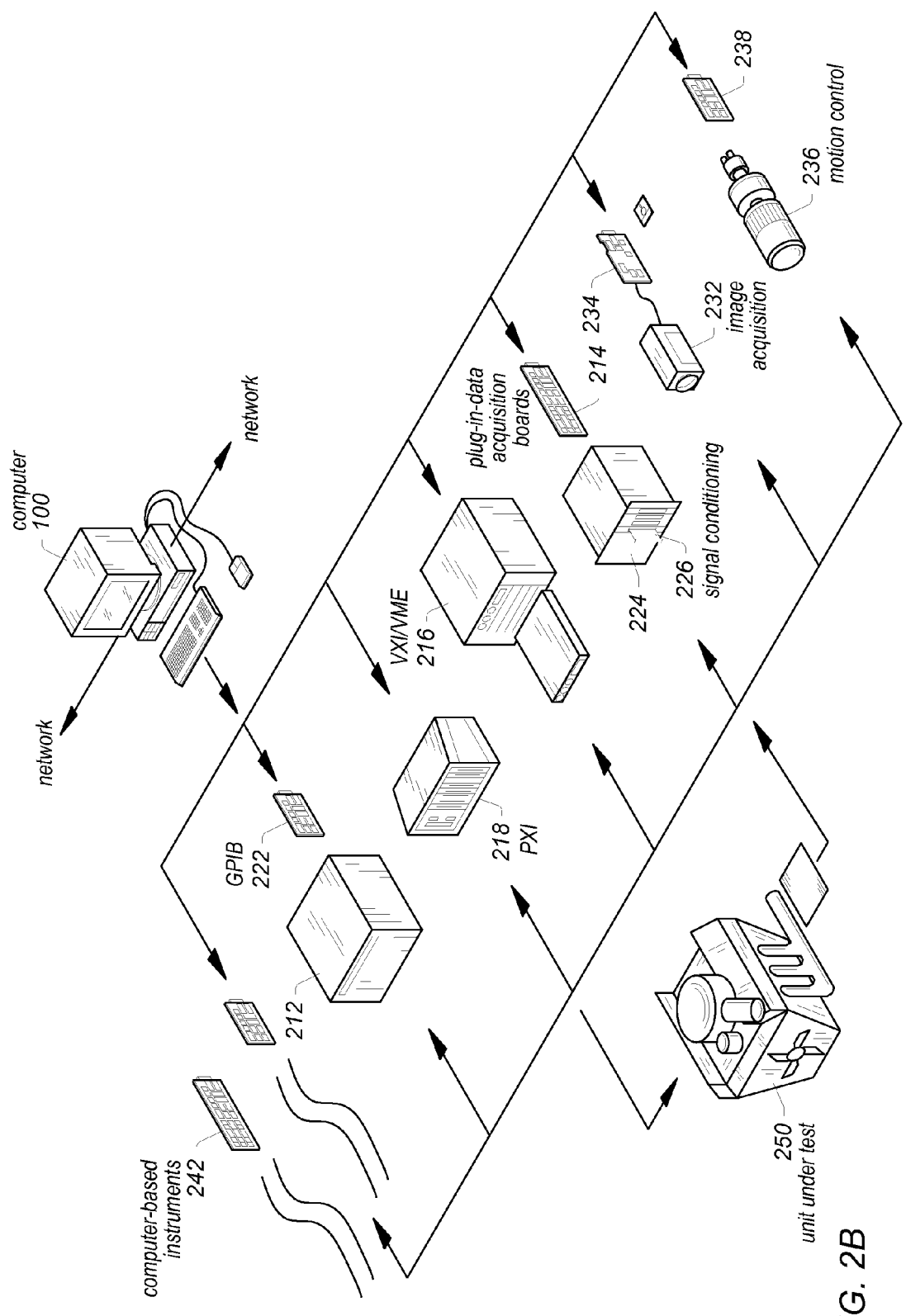
Figure 2C:
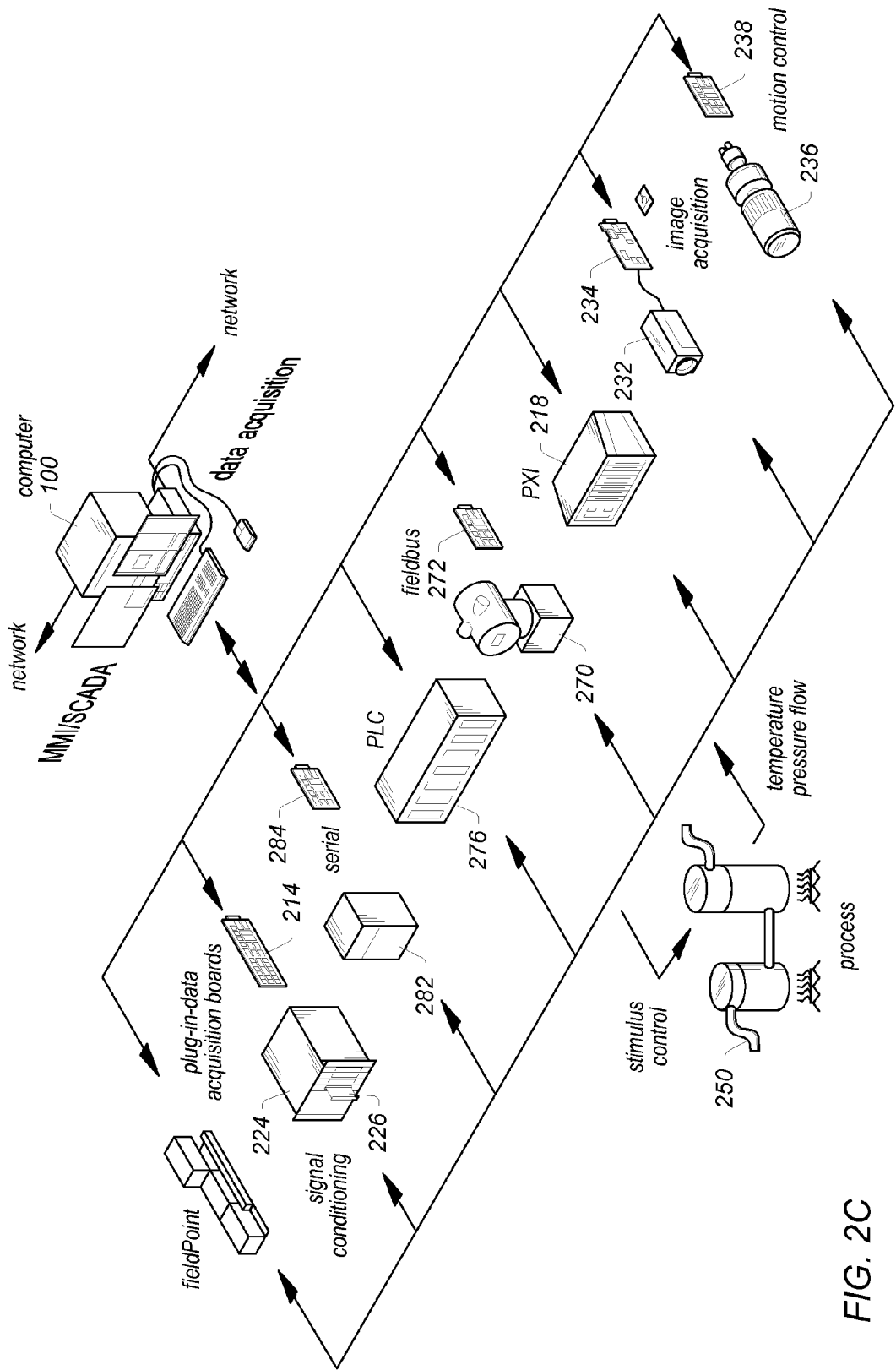

FIGS. 2A-2C—Exemplary Measurement Systems

FIGS. 2A-2C illustrate host device 100 as a computer system. As shown in FIG. 2A, the host device 100 may be coupled to chassis 50 (e.g., including the first device 125 and the second device 150) and may include a display device and one or more input devices. Similar to descriptions of the host device 100 above, the host may include at least one memory medium on which one or more computer programs or software components according to one embodiment of the present invention may be stored. The memory medium may also store operating system software, as well as other software for operation of the computer system. Various embodiments further include receiving or storing instructions and/or data implemented in accordance with the foregoing description upon a carrier medium.

In various embodiments, the host device 100 may be coupled to a second computer system or device via a network (or a computer bus). The computer systems may each be any of various types, as desired. The network can also be any of various types, including a LAN (local area network), WAN (wide area network), the Internet, or an Intranet, among others.

FIG. 2B illustrates an exemplary instrumentation control system which may implement embodiments of the invention. As shown, the system comprises a host device 100 which couples to one or more other devices (e.g., which may be the device 125 and/or the device 150 described above). The host device may operate with the one or more devices to analyze, measure or control a unit under test (DUT) or process.

The one or more devices may include a GPIB instrument 212 and associated GPIB interface card 222, a data acquisition board 214 inserted into or otherwise coupled with chassis 224 with associated signal conditioning circuitry 226, a VXI instrument 216, a PXI instrument 218, a video device or camera 232 and associated image acquisition (or machine vision) card 234, a motion control device 236 and associated motion control interface card 238, and/or one or more computer based instrument cards 242, among other types of devices. The computer system may couple to and operate with one or more of these devices. The instruments may be coupled to the unit under test (UUT) or process, or may be coupled to receive field signals, typically generated by transducers. The system may be used in a data acquisition and control application, in a test and measurement application, an image processing or machine vision application, a process control application, a man-machine interface application, a simulation application, or a hardware-in-the-loop validation application, among others.

FIG. 2C illustrates an exemplary industrial automation system which may implement embodiments of the invention. The industrial automation system is similar to the instrumentation or test and measurement system shown in FIG. 2B. Elements which are similar or identical to elements in FIG. 2B have the same reference numerals for convenience. The system may comprise a host device 100 which couples to one or more devices or instruments. Similar to above, the host device 100 may comprise a CPU, a display screen, memory, and one or more input devices such as a mouse or keyboard as shown. The host device 100 may operate with the one or more devices to perform an automation function with respect to a process or device, such as MMI (Man Machine Interface), SCADA (Supervisory Control and Data Acquisition), portable or distributed data acquisition, process control, advanced analysis, or other control, among others.

The one or more devices may include a data acquisition board 214 inserted into or otherwise coupled with chassis 224 with associated signal conditioning circuitry 226, a PXI instrument 218, a video device 232 and associated image acquisition card 234, a motion control device 236 and associated motion control interface card 238, a fieldbus device 270 and associated fieldbus interface card 272, a PLC (Programmable Logic Controller) 276, a serial instrument 182 and associated serial interface card 284, or a distributed data acquisition system, such as the Fieldpoint system available from National Instruments, among other types of devices.

Figure 3:
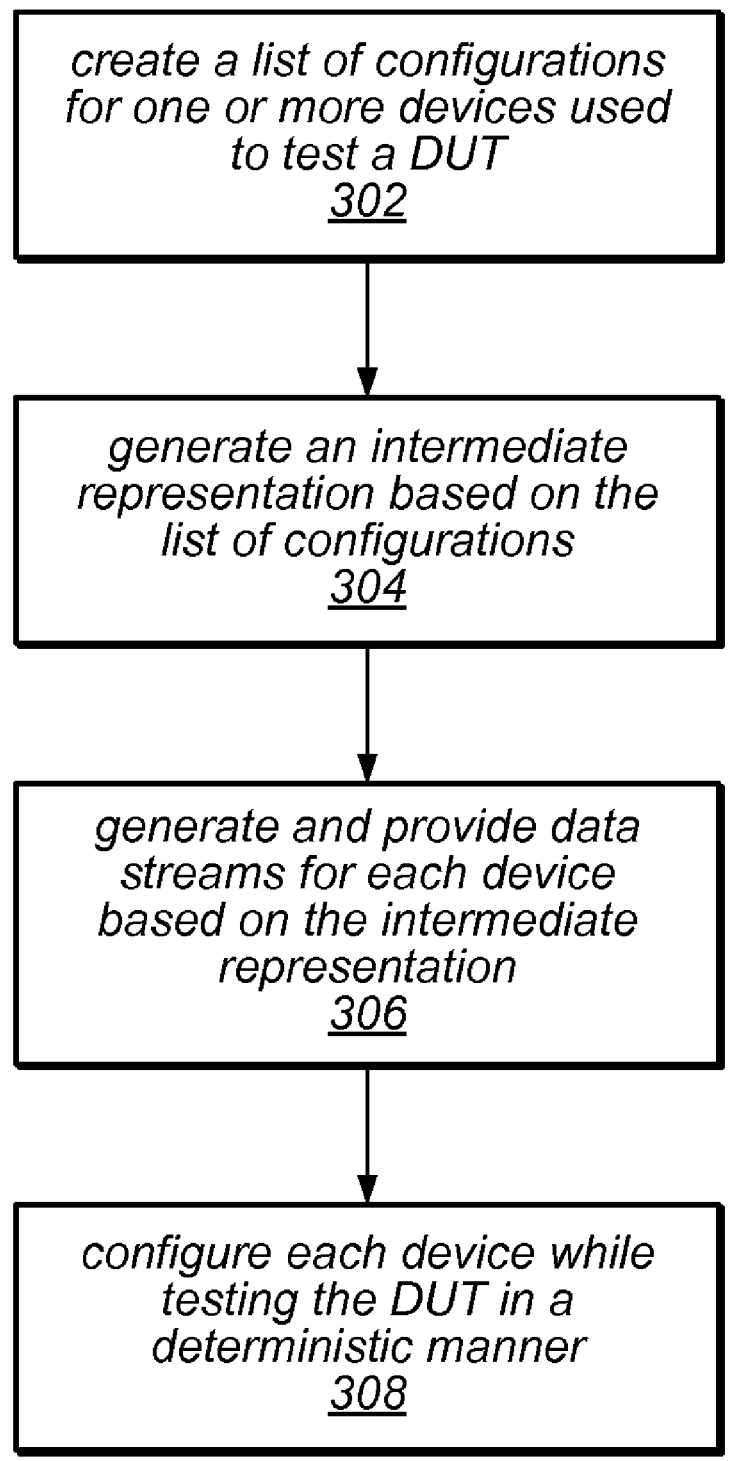
FIG. 3 is a flowchart diagram illustrating one embodiment of a method for deterministic reconfiguration of measurement modules.

FIG. 3—Configuration Changes for One or More Devices

FIG. 3 illustrates a method for changing configurations for one or more devices. The method shown in FIG. 3 may be used in conjunction with any of the computer systems or devices shown in the above Figures, among other devices. In various embodiments, some of the method elements shown may be performed concurrently, in a different order than shown, or may be omitted. Additional method elements may also be performed as desired. As shown, this method may operate as follows.

In 302, a list of configurations may be created, e.g., by a user or program. For example, in one embodiment, the user may create a list of RF configurations for testing an RF device. However, while the method described herein is applied to RF devices, it may be applied to any type of device or system, as desired. The list of RF configurations may include a set of RF instrument options, e.g., for each listed configuration, which may be set via the application programming interface (API) of an RF instrument driver.

The list of RF configurations may also include a specification of how to move the instrument from one item in the RF configuration set to another. For example, the API may allow the user to directly configure the use of a trigger bus, e.g., a PXI trigger bus for the purposes of advancing the RF devices through the RF list, e.g., specifying a configuration list step trigger source.

In one embodiment, the list of configurations may be specified using a host computer, such as the host 100 described above, although other devices are envisioned. The list of configurations may be specified graphically, e.g., in a graphical program, or textually as desired. Graphical program 410 of FIG. 4 illustrates a graphical program which specifies the configuration list using a graphical API.

In 304, from the list of RF configurations (e.g., specified using the API), an intermediate representation of the list may be created, e.g., by an instrument driver. The intermediate representation may be created by the host device. Additionally, the internal RF list representation may include synchronization instructions for each module that may effectively allow the configuration changes on each device to happen at approximately the same time (e.g., within a few micro or milliseconds). For this purpose, a device driver may be used to automatically program the modules to use a common bus, e.g., a PXI trigger bus. As indicated above, the assignment of the trigger bus may be provided using the API specification, e.g., by a user.

In 306, data streams may be created for each device involved in the test, e.g., each of the modules of the PXI-based RF instrument. FIG. 4, described below, illustrates this process for a VSG instrument, although this may similarly apply to a VSA instrument.

In 308, the devices (or modules of the devices) may be configured according to the data streams, e.g., while testing the DUT. Thus, according to the method of FIG. 3, a DUT may be tested by configuring one or more devices according to the list of configurations in a deterministic manner. Further descriptions of the mechanism for changing configurations and triggering the change of configurations are provided below.

Figure 5A:
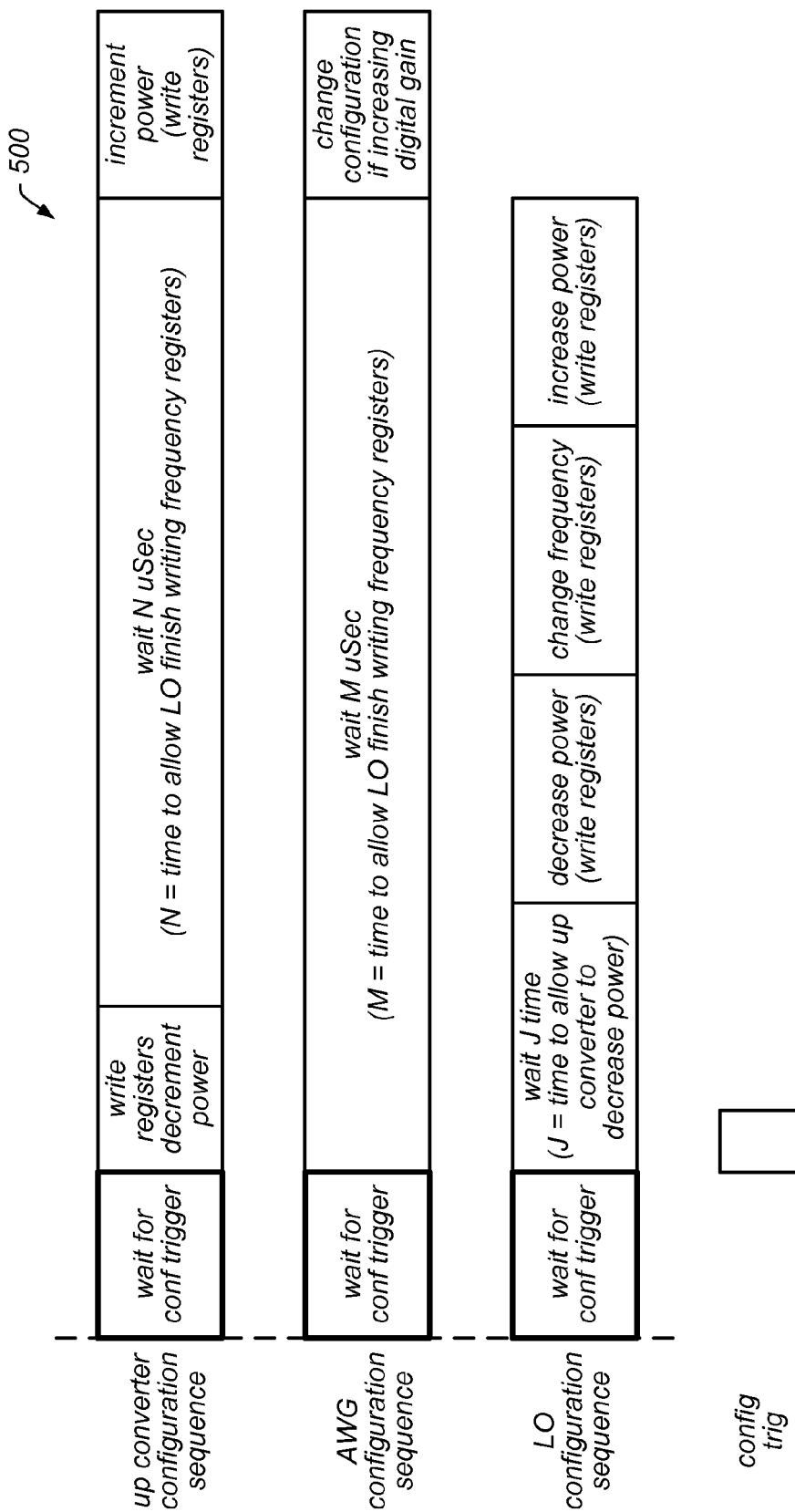
FIGS. 5A-5C are timing diagrams that illustrate timing of device reconfiguration according to the method of FIG. 3.
Figure 5B:
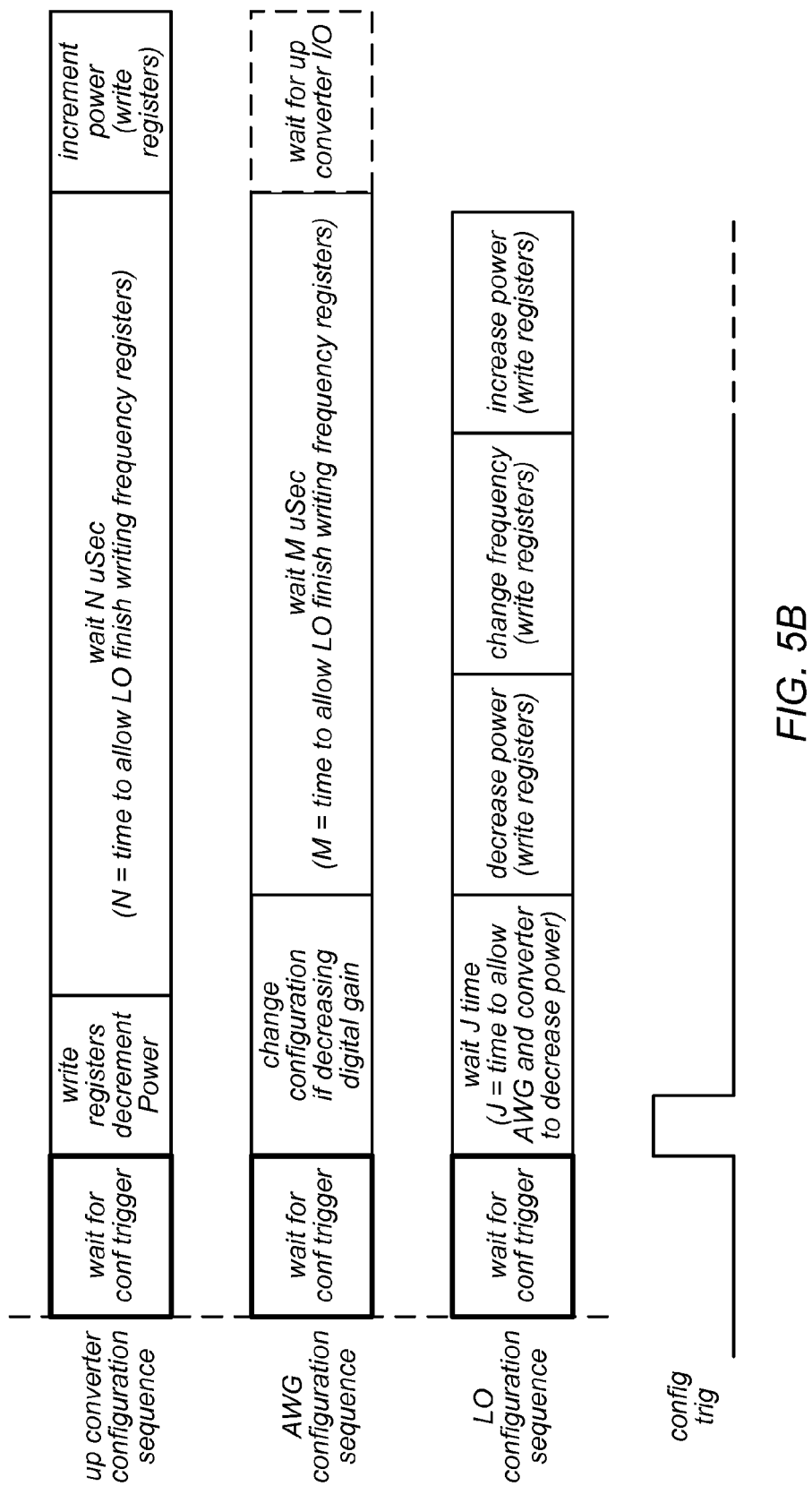
Figure 5C:
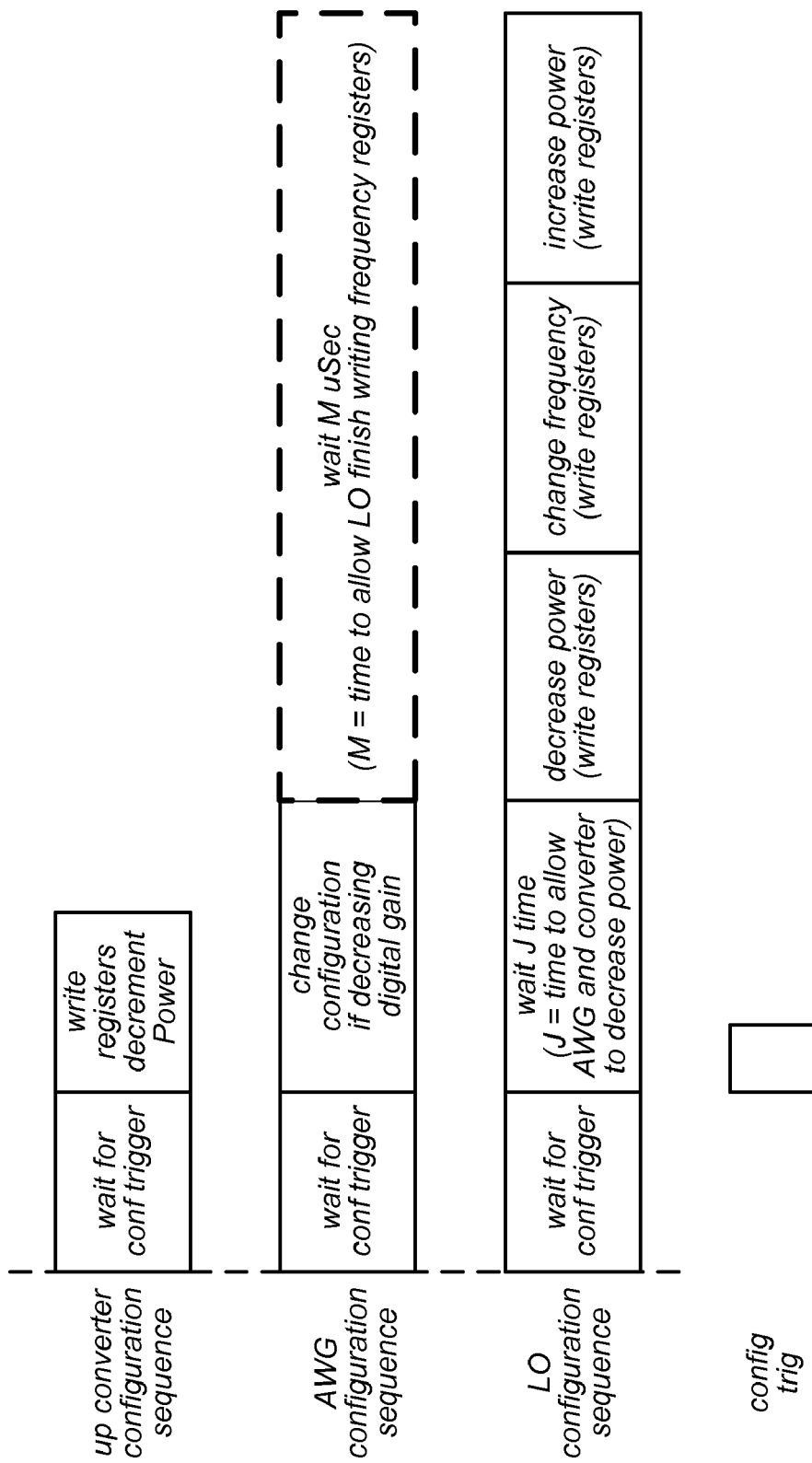

FIGS. 4-5C—Exemplary Diagrams Corresponding to FIG. 3

FIG. 4 is an exemplary diagram illustrating the method of FIG. 3 applied to three modules of a device (e.g., a VSG device). As indicated above, similar depictions and descriptions apply to other devices, such as a VSA device.

As shown in FIG. 4, the list of configurations may be specified graphically, e.g., in graphical program 410. More specifically, the graphical program 410 illustrates a graphical program which specifies the configuration list using a graphical API.

From the graphical specification of the configuration list, an internal representation of the configuration list is created, shown as 420.

As shown in FIG. 4, each module of the device includes a list processing unit (LPU) that is configured to accept an appropriately formed list, e.g., the data stream for that module, in a real-time and deterministic manner. Each of these module-specific, low-level lists has the instructions on how to program the corresponding RF configuration on each module.

However, the generated data stream for each module may cause programming of each module in a specific order. For example, in the case of the VSG, FIG. 5A represents an exemplary sequence (in a timing diagram 500) of hardware programming as executed by the appropriate LPU for one step. In this case, the config trig (the configuration trigger) may be received by all three modules, and the diagram illustrates the programming sequence for each module.

More particularly, as shown in FIG. 5A, the up converter module, the AWG module, and the LO module may each wait for the configuration trigger until it is received as shown. Accordingly, the up converter may first write registers and decrement power, then wait N μSec (where N allows the LO module to finish writing frequency registers), and then increment power (write registers). The AWG module, after receiving the configuration trigger, may also wait M μSec (where M allows the LO module to finish writing frequency registers) and then change configuration if the digital gain is being increased. Finally, the LO module, upon receiving the configuration trigger, may wait J μSec to allow the up converter to decrease power, decrease its own power (write registers), change frequency (write registers), and increase power (write registers). Once the LO completes these steps, the up converter and AWG modules may increment power and change configuration if increasing digital gain, respectively.

FIG. 5B illustrates the programming sequence when the AWG module changes configuration for decreasing digital gain before waiting M time and when the AWG module has to wait additional time for completion of up converter I/O, e.g., time required for up converter transactions. FIG. 5C illustrates the programming sequence when the AWG has to wait additional time for required LO transactions.

Note that the values of M, N, and J above may be 0 or greater, depending on the processes being performed by the various other modules or devices.

Figure 6:
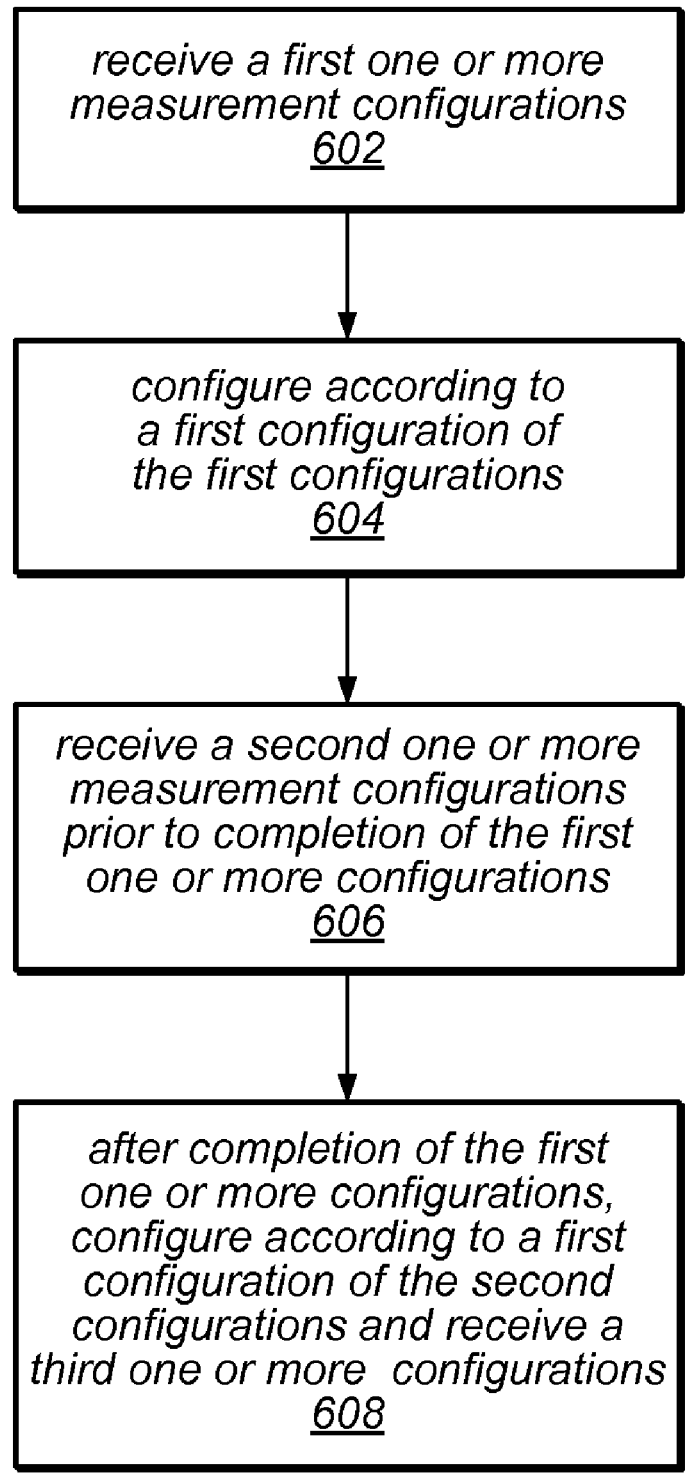
FIGS. 6 and 7 are flowchart diagrams illustrating embodiments of a method for deterministic reconfiguration of measurement modules using double buffering.

FIG. 6—Double Buffering Measurement Configurations

The following section specifically relates to an additional embodiment for configuring devices while testing a DUT. More specifically, double buffered measurement configurations may be used to modify the configuration list while testing is performed on the DUT. Thus, the method of FIG. 3 may be modified to include the following embodiments. In various embodiments, some of the method elements shown may be performed concurrently, in a different order than shown, or may be omitted. Additional method elements may also be performed as desired. As shown, this method may operate as follows.

In 602, the device may receive a first one or more (e.g., a plurality of) measurement configurations (e.g., RF measurement configurations) from a list of measurement configurations over a first DMA channel (e.g., from a host, such as a computer system). For example, the device may receive the measurement configurations from a host coupled to the device, e.g., from within a chassis, or external to a chassis, as desired.

The measurement configurations may be created and conveyed as described above, e.g., with respect to FIG. 3. For example, in one embodiment, the measurement configurations may be received as a data stream over a DMA channel. In some embodiments, the measurement configurations may be received as instructions embedded in DMA links. The device may store the first one or more measurement configurations in a memory medium, e.g., a first buffer. According to various embodiments, the first one or more measurement configurations may be a single configuration, or, more commonly, a plurality of measurement configurations. In some embodiments, the buffer may be a 2 k buffer which may store 100 configurations, although the buffer may be of various sizes for storing various numbers of configurations (e.g., 2, 5, 10, 20, 50, 100, 200, 500 configurations). A full capacity link of configurations may be referred to as a "chunky" link.

Accordingly, in 604, the device may configure itself according to a first measurement configuration of the first one or more measurement configurations. Each measurement configuration may be specified by one or more configuration links (e.g., where DMA links are used for configuration). The device may know how many of the configuration links to execute by looking for a marker between configurations (e.g., a page description between configuration links).

Subsequent to configuring itself, the device may begin performing one of the plurality of tests according to the first measurement configuration. For example, the first configuration may be used by the device to initiate a first test of the plurality of tests. In some embodiments, each configuration may be associated with a particular test, or a plurality of configurations may be required for a test, among various options.

In some embodiments, the device may initiate or cause the configuration by sending data over the first DMA channel. For example, the data may be "dummy" data, which does not serve a purpose other than initiating the configuration. Thus, by sending the data, the device may cause itself to execute the DMA links stored in the first buffer. However, in alternate embodiments, the data may serve another purpose as well. Note that in some embodiments, the measurement configurations received by the device may also include address information which may be used for sending the data.

Prior to completion of the first one or more configurations (e.g., completing corresponding tests using the first one or more configurations), in 606, the device may request one or more second measurement configurations using the first DMA channel. Accordingly, the device may receive and store the second measurement configurations over the first DMA channel, e.g., in a second buffer. Similar to above, the receiving and storing may be performed prior to completion of the first one or more measurement configurations and the second measurement configurations may be available for configuring the at least one device upon completion of the first one or more measurement configurations. As used herein, "completion of measurement configurations" refers to the device performing whatever test (or portion of a test) for which the measurement configuration is associated. Thus, where a VSG needs to generate a specific signal using a specific configuration, upon generating the signal according to the configuration, the configuration may be "completed" and the device may configure itself according to the next configuration. Thus, once the device has performed whatever action or test is associated with a configuration and a next test needs to be performed, the device has "completed" that measurement configuration. In some embodiments, the device may be notified that it has "completed" a configuration upon reception of a trigger (e.g., for triggering a plurality of devices) or upon reaching a predetermined time for advancing to the next configuration.

In one embodiment, the second one or more configurations may be received in response to the sending of the data over the DMA channel described above, e.g., when of the buffers or available (e.g., in this case, where the second buffer is empty). Thus, whenever new configurations are executed and there is room in a buffer available (e.g., when the buffer is completely unused), new configurations may be stored in the available buffer. Note that in this embodiment, where there are a plurality of received configurations, the reception of additional configurations may not occur each time data is sent over the DMA channel. Instead, additional configurations may not be requested or received unless there is space available in a buffer. However, where only a single configuration is stored in each buffer, the additional configurations may be received each time a configuration is used, thereby ensuring that a new configuration is always available upon completion of the previous configuration, without having to wait to receive the new configuration. In alternate embodiments, new configurations may be stored whenever space is available in a buffer, regardless of whether the buffer is completely available or only partially available.

Upon completion of the first one or more measurement configurations, in 608, the device may request one or more additional (third) measurement configurations, and, in response, the device may receive and store the one or more additional measurement configurations, e.g., in the first buffer. More specifically, in embodiments where the first one or more measurement configurations initially take up the entirety of the first buffer, once those are "completed", third measurement configurations may be requested. Similar to above, the configurations may be received in a data stream over the DMA channel. Additionally, the device may configure itself to the second configurations (e.g., a first configuration of the second configurations) upon completion of the first configurations. Similar to above, this process may be invoked by sending data to the host over the DMA channel, as desired.

Thus, in one embodiment, the device may perform the above configuring, requesting, receiving, and storing a plurality of times to perform the plurality of tests on the DUT in a deterministic manner. Note that using embodiments described herein, the device may be configured according to an arbitrary number of configurations which may be changed "on the fly" since they are being provided in the manner described. For example, a user may change the order of configurations or the number of future configurations at any time during testing of the DUT, assuming those configurations have not already been fetched and/or "completed" by the device(s).

Figure 7:
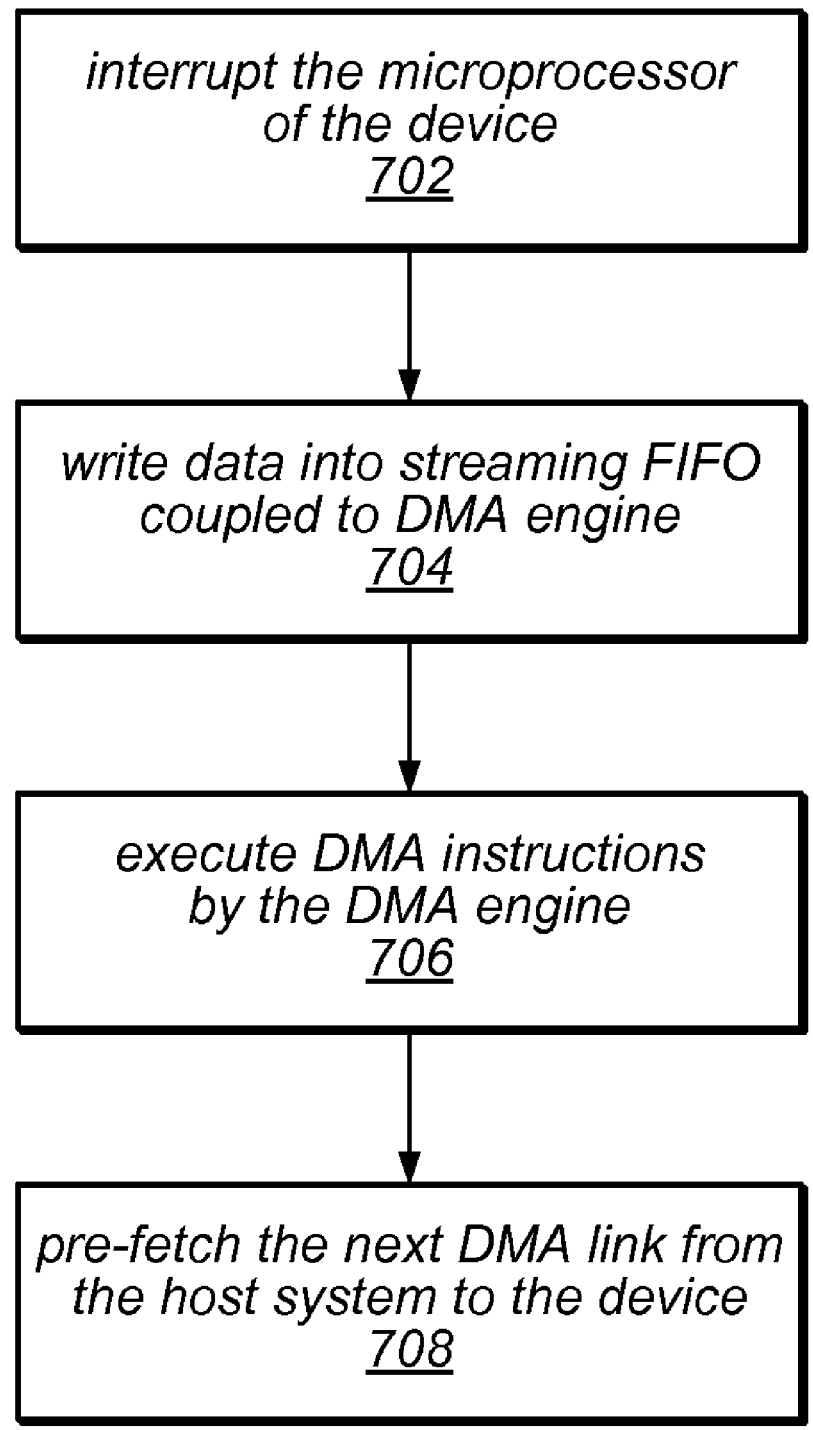
Figure 8:
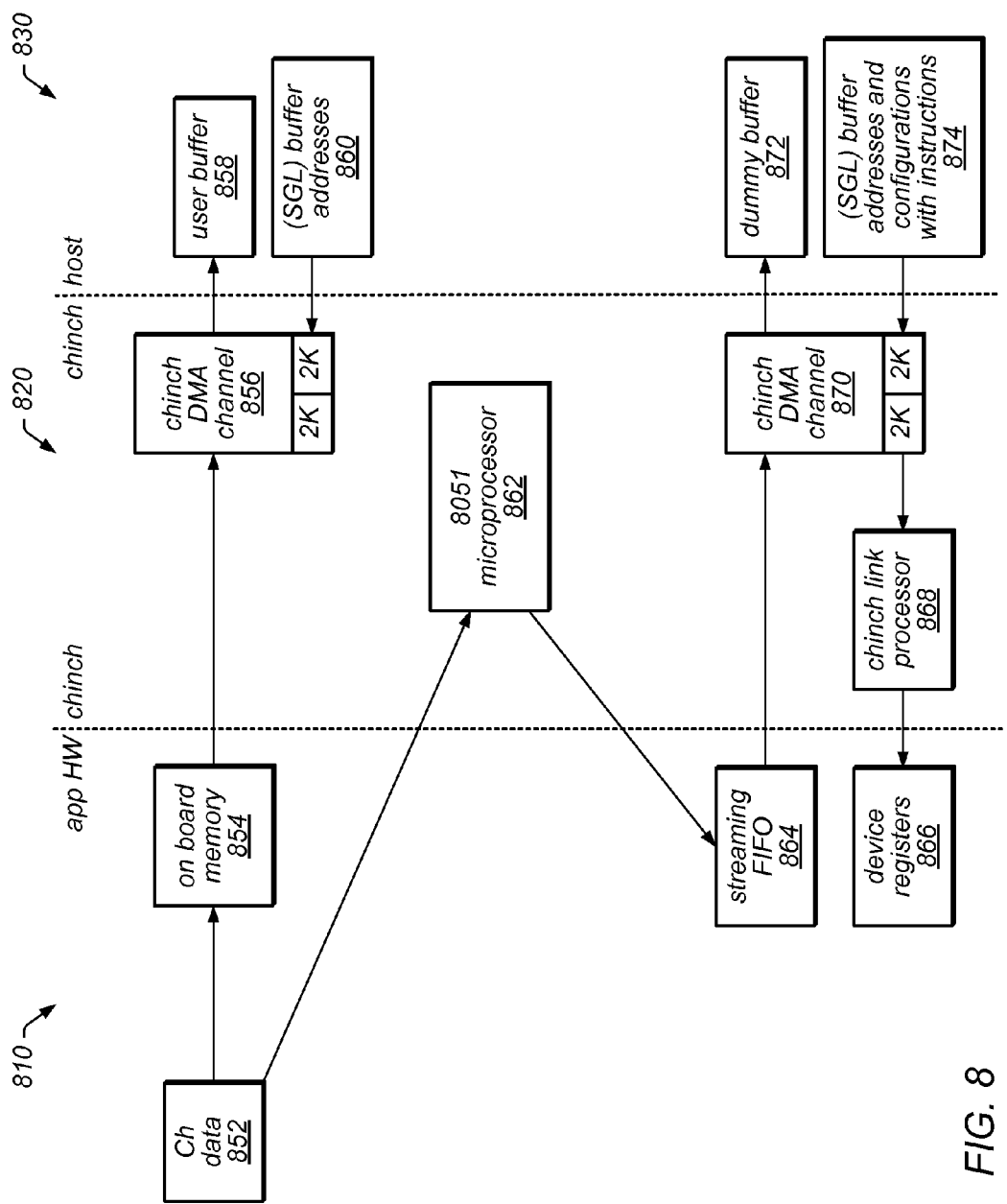
FIG. 8 illustrates operation of the system according to the method of FIG. 6.

FIGS. 7 and 8—Specific Embodiments of Double Buffering

FIGS. 7 and 8 provide a more specific embodiment of the double buffering of measurement configurations described in FIG. 6. The method shown in FIG. 7 may be used in conjunction with any of the computer systems or devices shown in the above Figures, among other devices. In various embodiments, some of the method elements shown may be performed concurrently, in a different order than shown, or may be omitted. Additional method elements may also be performed as desired. FIG. 8 shows a representation of the overall system diagram, specifically for the base-band digitizer.

Note that this section may particularly apply to digitizers and arbitrary waveform generators, also known as base-band modules in modular (e.g., PXI-based) RF instruments. However, the details relating to the double-buffered DMA apply equally to other devices, such as AWGs.

In 702, the timing engine in the hardware (section 810 of FIG. 8), may interrupt the microprocessor (e.g., the LPU 862, which may be an 8051 microprocessor) (section 820). Note that 820 of FIG. 8 may be referred to as the "chinch" portion, which may be hardware (e.g., an ASIC) which abstracts a hardware device from the bus (e.g., PXI, PXIe, PCI), e.g., for PXIe. According to some embodiments, this may be performed in a periodic fashion, e.g., at regular hardware-timed intervals. In some embodiments, this may occur at an "end of record" of acquired data on the baseband digitizer.

In 704, the microprocessor 862 may write a piece of data into the streaming FIFO 864 causing, in 706, the DMA engine 870 to execute the DMA links, e.g., instructions.

During the process, in 708, the DMA engine may automatically pre-fetch the next DMA link from the host system (buffer 874) to the device (device registers 866). This DMA transfer may include low level instructions corresponding to the list of configurations. Accordingly, while the DUT is being tested, the device may receive and be configured according to the list of configurations. The device (e.g., the chinch 820) may configure itself using link processor 868. Note that link processor 868 may normally (e.g., for typical DMA operations) load the address on the host to send and receive data from. However, as described herein, the link processor 868 may cause or perform configuration of the device by processing configuration links, e.g., in response to sending data to the host, such as dummy data. Additionally, because the configurations are provided during the testing of the DUT in this embodiment, the list of configurations may be changed "on the fly", allowing the list of configurations to be reordered, added to, etc. while the DUT is being tested.

The following provides one specific example describing how the number of configuration links to execute is determined. However, this is exemplary only and other methods are envisioned.

In a normal DMA operation, the configuration links may include the address on the host to send data to and the contiguous amount of address space available from that address. In this example, 100 bytes may be sent from the device to the host. Accordingly, on the host, only two 50 byte segments of contiguous RAM may be available. Based on this, the host may send two configuration links with starting address of the segments of RAM on the host and the number of bytes in those segments (in this example 50) to the DMA channel on the device. If the device sends 50 bytes to the DMA channel, it will execute the first configuration link and wait for more data from the device before executing the next configuration link.

This "pausing ability" of the DMA channel may be used to throttle the execution of the configuration links. In this example, a configuration link that has a host RAM address may be referred to as a "page descriptor" link and a configuration link that has the special instruction to write a register may be referred to as a "self config" link. Accordingly, an instruction list with two steps and two write register commands could appear as:
1. Page descriptor, 2. Self config link, 3. Self config link, 4. Page descriptor, 5. Self config link, 6. Self config link Each time the hardware pushes a piece of data (e.g., dummy data) into the DMA channel, one of the page descriptors and all of the self config links behind it may be executed until the DMA channel hits another page descriptor. At this point the DMA channel may pause (because the hardware hasn't pushed any additional data into the DMA channel, at least until the next step).

As shown in FIG. 8, the channel data 852 from the device may be provided from on board memory 854 to DMA channel 856 to the host (user buffer 858). The host may also provide information back to the DMA channel 856 via buffer 860. In one embodiment, the device driver may be used to create data structures stored in buffers 860 and 874. Buffer 874 may store a data structure which includes hardware configuration instructions in addition to DMA related content. Note that in the case of an AWG, the data may be provided in the reverse direction, from the host to the device. Thus, using the DMA channel 856, data is transferred, and using the DMA channel 870, the device may be configured according to the list of configurations. Thus, by using two separate DMA channels, the process may be deterministic and unaffected by other host and bus traffic.

Figure 9:
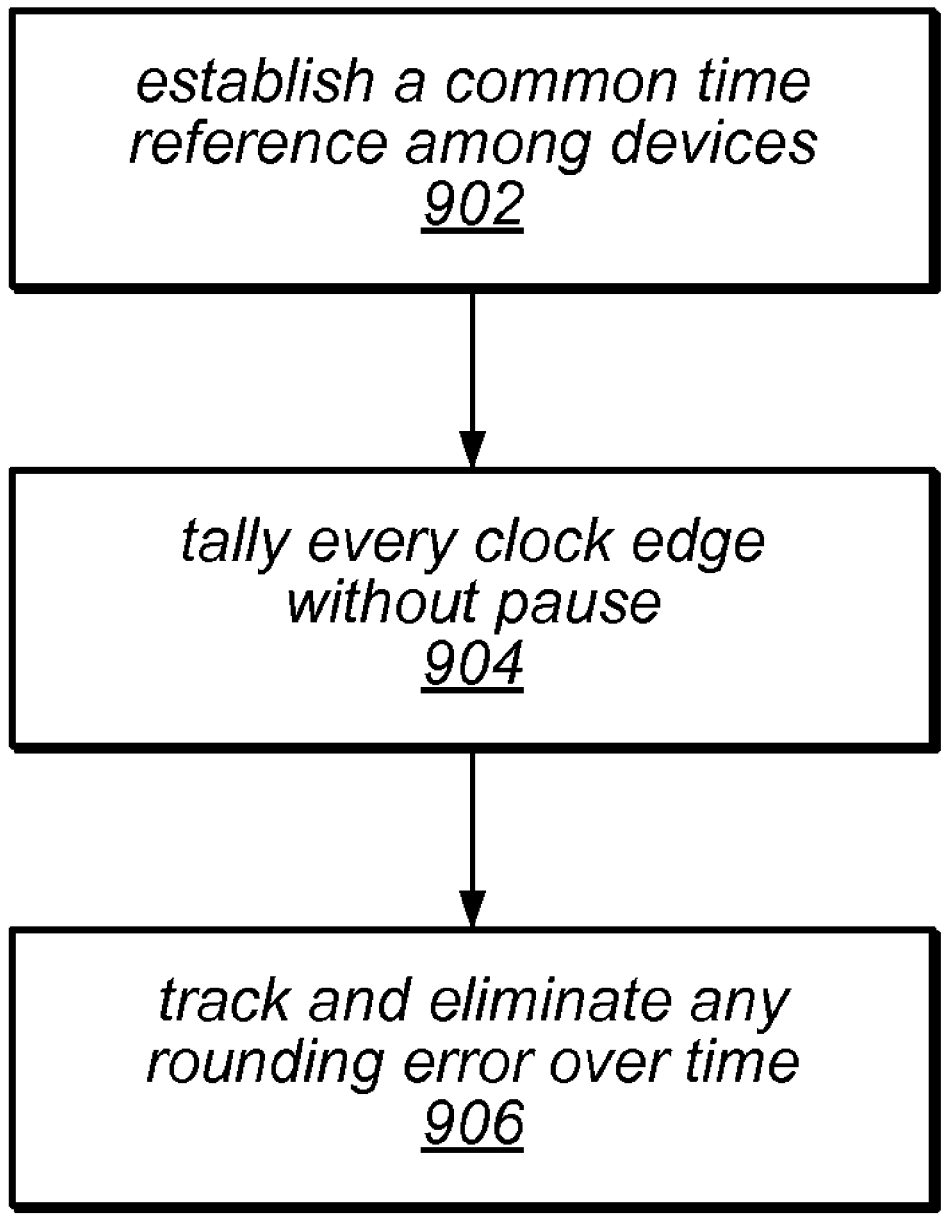
FIGS. 9 and 10 are flowchart diagrams illustrating embodiments of a method for open loop synchronization.
Figure 10:
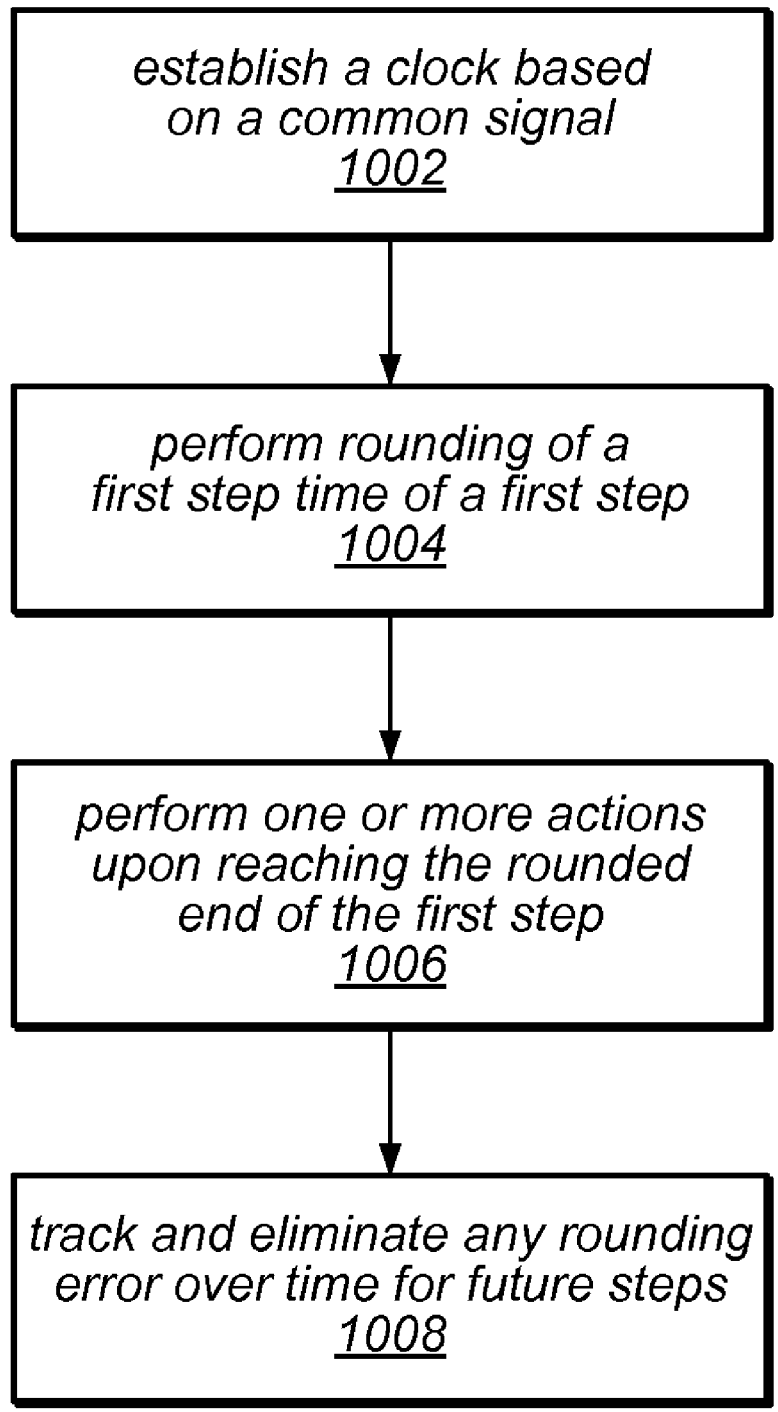

FIGS. 9 and 10—Open Loop Synchronization Using Self-Correcting Timers

In test and measurement, various different modules or subsystems running at different clock, sample, or update rates may need to be synchronized. As used herein, synchronization is the process of ensuring signals on each module or subsystem can occur either simultaneously, or at precisely controlled times with respect to one other.

As described above, a list of configurations may be used to sequence one or more test and measurement devices ("devices") through a series of reconfigurations. Each reconfiguration may change one or more characteristics of the test and measurement devices, including frequency, power level, and other parameters. As also described, the list of configurations may be used to synchronize the reconfiguration times of one or more devices with each other and, if desired, a DUT. For example, consider the following sequence:

Two VSGs generate a stimulus waveform.
A DUT responds to the stimulus.
A VSA measures the DUT's response waveform.
Every 100 ms, the two VSGs simultaneously reconfigure to a new frequency.
Every 200 ms, but aligned 5 ms before a stimulus change, the VSA reconfigures to a new power level.

FIG. 9 illustrates a method for open loop synchronization using self-correcting timers, which may be applicable to the above scenario. The self-correcting timer mechanism, described below, may be implemented on any of the devices or modules described herein. For example, it may be implemented on any device that regulates reconfigurations, e.g., modules that drive a configuration trigger. Thus, the method shown in FIG. 9 may be used in conjunction with any of the computer systems or devices shown in the above Figures, among other devices. For example, the method of FIG. 9 may be used to keep multiple devices in synch across multiple iterations and/or configuration changes. In various embodiments, some of the method elements shown may be performed concurrently, in a different order than shown, or may be omitted. Additional method elements may also be performed as desired. As shown, this method may operate as follows.

In 902, each device may establish a timer, e.g., implemented as a clocked counter, that can be selected as the source for the configuration trigger. In one embodiment, to avoid cumulative timing drift over the course of an operation, especially a long or continuous operation, a common time reference that is shared between all the devices may be established. Note that the common time reference may also apply to the DUT.

In general, the devices may be configured to share a frequency reference, a trigger, or both. Each of the devices may (a) use the frequency reference directly as a clock or (b) derive one or more clocks from the frequency reference. Circuits such as phase-locked loops, digital locked loops, and clock dividers may be used to derive clocks locked to the frequency reference. If starting alignment is important, the devices may also share a trigger to establish a common "time zero". See U.S. Publication 2008/0240321 and U.S. Pat. No. 7,315,791, incorporated by reference above, for further details on techniques that can improve determinism when sharing triggers. Thus, where a common frequency reference is used, the counter's clock may be the frequency reference or some clock locked to the frequency reference. Additionally or alternatively, if a common trigger is used, depending on the type of trigger, the counter may be started by the trigger or the position of the trigger may be recorded relative to the counter. In one embodiment, the timer may be implemented as an incrementing counter that starts from zero.

Once the timer begins counting, in 904, it may continue without pause or, if it pauses, may pause only for a known and deterministic time. For example, where the timer is implemented as a counter, it may tally every clock edge without pause. By never pausing (or pausing only for known times), the timer may obviate any need to synchronize pauses with other devices. The timer may continue for the duration of the list of configurations or testing of the DUT.

In one embodiment, the counter may be programmed initially with the first desired interval for generating a configuration trigger: Each interval may be rounded (for example, truncated) to an integer number of clock cycles. At the expiration of the interval, the timer may emit a configuration trigger. In one embodiment, the interval is a terminal-count register for the incrementing counter. The timer may "roll over" and reset to its initial count after reaching the terminal count. However, the reset process may not pause the timer (unless for a known time), e.g., the timer may continue to advance deterministically. Subsequently, the timer may be loaded with the value for each successive interval, if different. As with resetting, the process of loading a new interval value may not pause the timer (unless for a known time); the timer may continue to advance deterministically.

In 906, the device (e.g., each device) may track and eliminate (self-correct) any rounding error over time: Rounding to an integer number of clock cycles typically introduces error. When the accumulated error exceeds one clock cycle, a cycle may be added to or subtracted from the next timer interval to correct. For example, if the first desired interval is 150.5 clocks, the timer may be programmed for 150 clocks. If the second desired interval is also 150.5 clocks, the timer may be programmed for 151 clocks: the new desired interval, plus a correction for the accumulated error. The error tracking is equivalent to implementing additional, less-significant bits on the timer below the units bit—that is, to implementing fractional bits. The desired timing precision dictates the number of fractional bits required. For single-iteration operation, it may be possible to pre-compute the rounded timer values. However, to support a general case that may include continuous or looping operation, the device may tally and compensate for rounding error while running. In one embodiment, the fractional bits may be implemented using an adder in an arithmetic logic unit under control of an embedded program. Alternatively, e.g., where an arithmetic logic unit is unavailable or undesirable, fractional-bit tracking may be added to the timer hardware.

However, it should be noted that care should be taken in rounding: The clock rate of the timer should be fast enough relative to the reconfiguration intervals that the jitter introduced by rounding to an integer clock cycle is acceptable. In the case of continuous or looping operation, the same interval on different loop iterations may vary in length by one clock cycle due to rounding. Optionally, this cycle-to-cycle variation may be isolated to a single step of the recurring sequence. This can be accomplished by pre-computing the rounded timer values for all steps except one, and the rounded timer values for the remaining step may be computed while running.

In some embodiments, the clocks, update, and sample rates of the various devices in the system can differ. In this case, the rounding on each device may be different. However, each device may be configured to self-correct to "absolute time". Assuming that the devices share a common frequency reference (or have sufficiently precise and stable independent frequency references) and that sufficient precision is used in the error-tracking math, the devices do not drift significantly from each other over time.

FIG. 10 illustrates an exemplary embodiment of the method for open loop synchronization using self-correcting timers, which may be applicable to the above scenario. Note that while the specific examples and embodiments of FIG. 9 may be applicable to the embodiment of FIG. 10, they do not limit the scope of following embodiments. FIG. 10 is described in the context of a loop, which may loop over multiple iterations, each iteration including one or more steps. Each step may be associated with a particular action (e.g., a configuration or test). In some embodiments, each iteration may be the same as the next, e.g., each iteration may include a plurality of configurations for testing a DUT, and those configurations may continue to execute in an "open" manner until they are stopped or changed. However, other embodiments are envisioned where each iteration includes different steps, as desired.

Various embodiments are disclosed of a system and method for maintaining synchronization among a plurality of devices using clocks, wherein the plurality of devices operate together for a plurality of iterations in a looped manner.

In 1002, each device may establish a clock based on a common signal or signals. For example, as indicated above, the common signals may be a frequency reference and/or trigger, as desired. Each clock may not pause and may have a constant relationship with each other clock over time.

In 1004, each device may round a first step time of a first step of a first iteration to one of two first nearest clock cycles, e.g., where the first step time does not occur on either of the two first nearest clock cycles. In some embodiments, the rounding may be to the absolute nearest clock cycle (e.g., to the clock cycle immediately before or after the first step time). Alternatively, the rounding may be performed to the nearest clock cycle before the first step time or the nearest clock cycle after the first step time, as desired.

In 1006, upon reaching the one of the two first nearest clock cycles, each device may perform a respective first action in a synchronized manner with respect to the other devices. In one embodiment, the action may be a reconfiguration, e.g., which determines device or test parameters, including the next step time. For example, the next step time may be determined based on received information which specifies the reconfiguration. Alternatively, or additionally, each step time may be determined based on a counter (e.g., a non-pausing counter) for the clock. In some embodiments, each step time may be based as an increment from the previous step, or a cumulative time, as desired.

In 1008, over one or more additional steps of the loop, each device may adjust clock cycles for each of the one or more additional steps to remove rounding error. The adjustment may be performed dynamically during run time. Upon reaching the end of a step, each device may perform a respective action in a synchronized manner with respect to the other devices.

Thus, the method described above may be performed a plurality of times over various steps. For example, the method may be performed each step of each iteration, or possibly for one or more steps in each iteration (thus adjusting for rounding errors in each iteration). In one embodiment, for example, each device may round a second step time of a second step of the first iteration to one of two second nearest clock cycles and the second rounding may incorporate the rounding of the first step time of the first step. Correspondingly, the determined clock cycle, each device may perform a respective second action in a synchronized manner with respect to the other devices.

Figure 11:
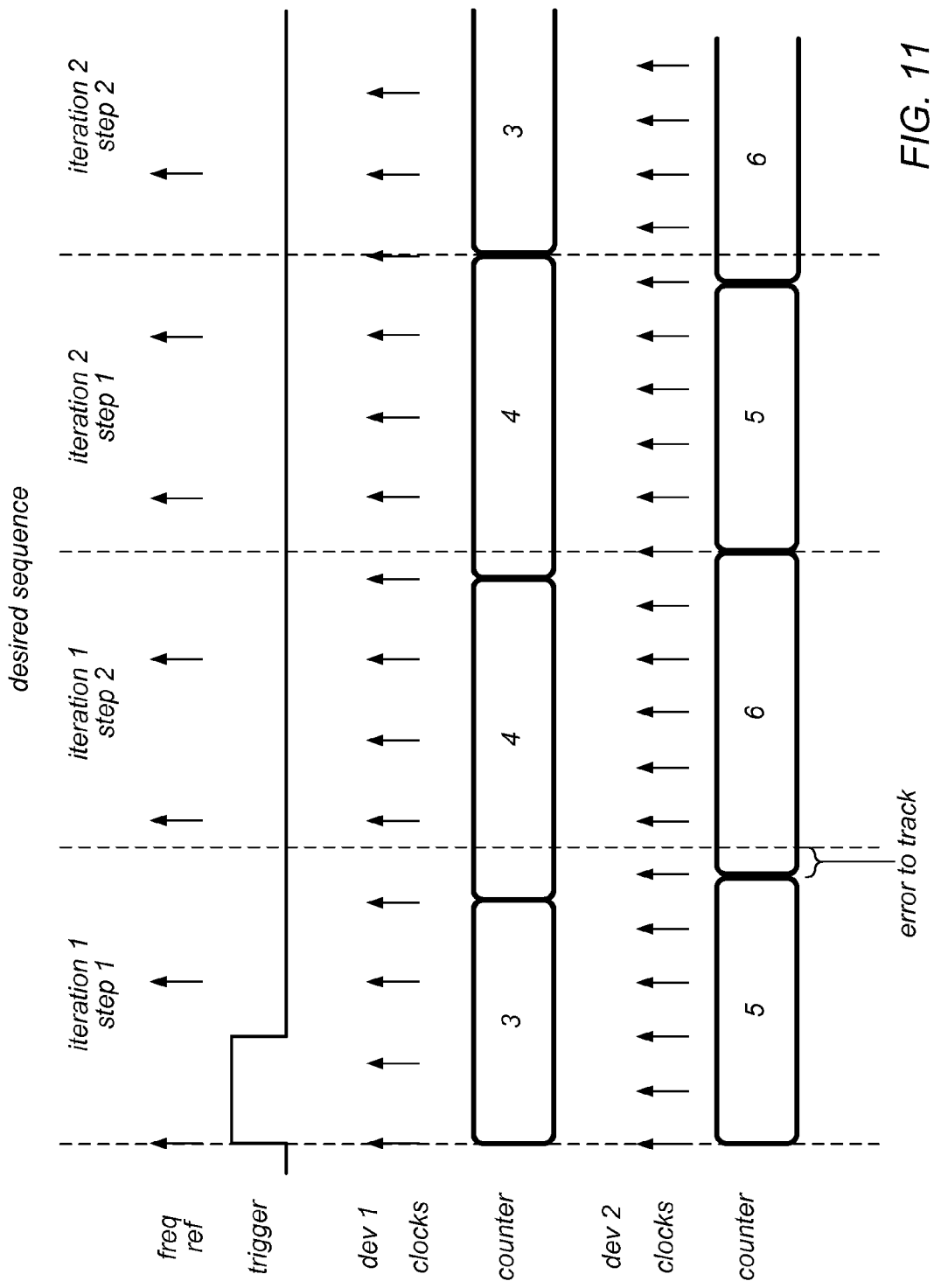
FIG. 11 is an exemplary timing diagram corresponding to one embodiment of the method of FIG. 9.

FIG. 11—Exemplary Timing Diagram

FIG. 11 illustrates a timing diagram showing two devices performing tasks according to one embodiment of the synchronization described above. As shown, a first device (dev 1) may operate at a clock rate which is slower than the clock rate of a second device (dev 2). These two devices may perform tasks over multiple steps and iterations in a synchronized manner As shown, at time 0, both devices may receive a trigger to use as a common start or reference time. Each device may then determine (or receive) a nearest clock cycle before the next step (a dotted line shows the start of each step). In this instance, device 1 determines that the next task should begin after three clocks for iteration 1, step 1, four clocks for iteration 1, step 2, four clocks for iteration 2, step 1 (which resolves all of the accumulated error from the previous two steps), and three clocks for iteration 2, step 2. Similarly, device 2 (operating with a faster clock, and therefore having less error on any given iteration) determines that the next task should begin after five clocks, six clocks, five clocks, and six clocks for each respective step. Thus, the two devices both use clocks to monitor error over multiple steps and iterations and are able to perform the changes of tasks in a synchronized manner.

Applicability to Configuration Lists

When incorporated in the configuration lists described above, the timer intervals themselves can be modified as part of a reconfiguration. Therefore, the sequence of configuration trigger times is arbitrary and potentially infinite. If desired, the sequence of intervals can differ for different devices. The self-correcting timer mechanism, while particularly applicable for the needs of lists of configurations described herein, may have more general application to synchronization of events across devices for any of various purposes.

Advantages of Open-Loop Synchronization

Various embodiments of the open-loop synchronization, described above, offers several benefits:

Supports "open loop" operation: that is, it may not require signal exchange, other than (optionally) a frequency reference and a one-time trigger to establish a common time reference.

Supports heterogeneous operation: The mechanism can synchronize similar or dissimilar devices running at similar or dissimilar clock, sample, and update rates.

Achieves high accuracy. Dissimilar devices need not drift over time, and absolute time accuracy is limited only by the stability and precision of the frequency reference.

Supports both single-iteration and continuous, looping operation.

Requires no special circuitry on the DUT.

Although the embodiments above have been described in considerable detail, numerous variations and modifications will become apparent to those skilled in the art once the above disclosure is fully appreciated. It is intended that the following claims be interpreted to embrace all such variations and modifications.

I claim:

1. A method for configuring a plurality of devices according to a plurality of measurement configurations for performing a plurality of tests on a device under test (DUT), the method comprising:

creating a list of measurement configurations in a computer memory, wherein the list of measurement configurations comprises a plurality of parameters for configuring operation of the plurality of devices to perform the plurality of tests, wherein the list of measurement configurations further comprises synchronization instructions for enabling the plurality of devices to synchronize configuration changes for each measurement configuration in the list of measurement configurations;

providing information regarding the list of measurement configurations to the plurality of devices, wherein the information is usable by the plurality of devices to perform the plurality of tests on the DUT, wherein said performing the plurality of tests on the DUT comprises each of the plurality of devices configuring itself according to the list of measurement configurations and the synchronization instructions based on the information, wherein said configuring enables the plurality of devices to perform the plurality of tests on the DUT in a deterministic and synchronized manner.

2. The method of claim 1, further comprising:
the plurality of devices performing the plurality of tests on the DUT.

3. The method of claim 2, wherein each of the plurality of devices configuring itself according to the measurement configurations comprises each of the plurality of devices executing deterministic software processes that processes the information for reconfiguration.

4. The method of claim 1, wherein the plurality of devices comprises a signal measurement device and a signal generating device.

5. The method of claim 1, wherein the plurality of devices comprises radio frequency (RF) devices, and wherein the plurality of measurement configurations are RF measurement configurations.

6. The method of claim 1,
wherein the plurality of devices comprises a plurality of measurement modules housed in a chassis;
wherein the plurality of measurement modules are electrically coupled by an instrumentation bus.

7. The method of claim 1, further comprising:
creating an intermediate representation of the list of measurement configurations; and
generating the information based on the intermediate representation.

8. The method of claim 1, wherein said providing the information comprises providing a data stream to the plurality of devices.

9. The method of claim 1,
wherein the list of measurement configurations further comprises a specification for reconfiguring the plurality of devices from a first item in the list of measurement configurations to a second item in the list of measurement configurations.

10. The method of claim 1, wherein said providing is performed using direct memory access (DMA).

11. A non-transitory computer accessible memory medium storing program instructions for configuring a plurality of devices according to a plurality of measurement configurations for performing a plurality of tests on a device under test (DUT), wherein the program instructions are executable to:
create a list of measurement configurations in a computer memory, wherein the list of measurement configurations comprises a plurality of parameters for configuring operation of the plurality of devices to perform the plurality of tests, wherein the list of measurement configurations further comprises synchronization instructions for enabling the plurality of devices to synchronize configuration changes for each measurement configuration in the list of measurement configurations;
provide information regarding the list of measurement configurations to the plurality of devices, wherein the information is usable by the plurality of devices to perform the plurality of tests on the DUT, wherein said performing the plurality of tests on the DUT comprises each of the plurality of devices configuring itself according to the list of measurement configurations and the synchronization instructions based on the information, wherein said configuring enables the plurality of devices to perform the plurality of tests on the DUT in a deterministic and synchronized manner.

12. A non-transitory computer accessible memory medium of claim 11, wherein the plurality of devices are configured to configure themselves according to the measurement configurations comprises the plurality of devices executing deterministic software processes that processes the information for reconfiguration.

13. A non-transitory computer accessible memory medium of claim 11, wherein the plurality of devices comprises a signal measurement device and a signal generating device.

14. A non-transitory computer accessible memory medium of claim 11, wherein the plurality of devices comprises radio frequency (RF) devices, and wherein the plurality of measurement configurations are RF measurement configurations.

15. A non-transitory computer accessible memory medium of claim 11,
wherein the plurality of devices comprises a plurality of measurement modules housed in a chassis;
wherein the plurality of measurement modules are electrically coupled by an instrumentation bus.

16. A non-transitory computer accessible memory medium of claim 11, wherein the program instructions are further executable to:
create an intermediate representation of the list of measurement configurations; and
generate the information based on the intermediate representation.

17. A non-transitory computer accessible memory medium of claim 11, wherein said providing the information comprises providing a data stream to the plurality of devices.

18. A non-transitory computer accessible memory medium of claim 11,
wherein the list of measurement configurations further comprises a specification for reconfiguring the plurality of devices from a first item in the list of measurement configurations to a second item in the list of measurement configurations.

19. A non-transitory computer accessible memory medium of claim 11, wherein said providing is performed using direct memory access (DMA).

20. A system for configuring a plurality of devices according to a plurality of measurement configurations in order to perform a plurality of tests on a device under test (DUT), comprising:
a processor; and
a memory medium coupled to the processor, wherein the memory medium stores program instructions executable by the processor to:
create a list of measurement configurations in a computer memory, wherein the list of measurement configurations comprises a plurality of parameters for configuring operation of the plurality of devices to perform the plurality of tests, wherein the list of measurement configurations further comprises synchronization instructions for enabling the plurality of devices to synchronize configuration changes for each measurement configuration in the list of measurement configuration;
provide information regarding the list of measurement configurations to the plurality of devices, wherein the information is usable by the plurality of devices to perform the plurality of tests on the DUT, wherein said performing the plurality of tests on the DUT comprises each of the plurality of devices configuring itself according to the list of measurement configurations and the synchronization instructions based on the information, wherein said configuring enables the plurality of devices to perform the plurality of tests on the DUT in a deterministic and synchronized manner.

* * * * *